US012633359B2

(12) United States Patent
Ameen Beshari et al.

(10) Patent No.: US 12,633,359 B2
(45) Date of Patent: May 19, 2026

(54) FAST AND EFFICIENT VERIFY RECOVERY AND ARRAY DISCHARGE FOR 3D NAND MEMORY ARRAYS

(71) Applicant: Intel NDTM US LLC, Santa Clara, CA (US)

(72) Inventors: Tarek Ahmed Ameen Beshari, San Jose, CA (US); Sagar Upadhyay, Folsom, CA (US); Shantanu R. Rajwade, San Mateo, CA (US); Rohit S. Shenoy, Fremont, CA (US); Golnaz Karbasian, San Jose, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 69 days.

(21) Appl. No.: 18/503,831

(22) Filed: Nov. 7, 2023

(65) Prior Publication Data

US 2024/0071532 A1 Feb. 29, 2024

(51) Int. Cl.

| | |
|---|---|
| *G11C 16/34* | (2006.01) |
| *G11C 7/14* | (2006.01) |
| *G11C 7/22* | (2006.01) |
| *G11C 16/04* | (2006.01) |
| *G11C 16/08* | (2006.01) |
| *G11C 16/32* | (2006.01) |

(52) U.S. Cl.
CPC ............ *G11C 16/3459* (2013.01); *G11C 7/14* (2013.01); *G11C 7/227* (2013.01); *G11C 16/0433* (2013.01); *G11C 16/08* (2013.01); *G11C 16/32* (2013.01)

(58) Field of Classification Search
CPC ....... G11C 16/3459; G11C 7/14; G11C 7/227; G11C 16/0433; G11C 16/08; G11C 16/32; G11C 11/5671; G11C 11/5628; G11C 16/10; G11C 16/3427; G11C 16/0483
See application file for complete search history.

(56) References Cited

U.S. PATENT DOCUMENTS

| | | | | |
|---|---|---|---|---|
| 2024/0079062 | A1* | 3/2024 | Guo | ................... G11C 16/3459 |
| 2024/0355401 | A1* | 10/2024 | Cao | ................... G11C 16/0433 |
| 2024/0395344 | A1* | 11/2024 | Ramanan | ........... G11C 16/0483 |

* cited by examiner

*Primary Examiner* — Donald HB Braswell
(74) *Attorney, Agent, or Firm* — Morgan, Lewis & Bockius LLP

(57) ABSTRACT

Methods and apparatus for fast and efficient verify recovery and array discharge for 3D NAND memory arrays and other 3D storage devices. The 3D storage device includes storage arrays including strings of memory cells stacked on top of one another and sharing a channel in a pillar for the string. The memory cells for a string occupy respective tiers in a 3D structure with each tier having an associated wordline. A controller is used to program charge levels in the memory cells. Programming is followed by a fast verify recovery where a voltage is applied to the wordlines to perform a program verify, followed by discharging wordlines. Erased wordlines are identified and discharged first, followed by programmed wordlines, which may employ staggered discharge sequences. Dummy wordlines are then discharged, with an optional timer delay. For multi-deck devices, wordlines in the deck with an active wordline are discharged before wordlines in one or more other decks.

20 Claims, 15 Drawing Sheets

420

410

430

423   421   422

CIRCUIT 600

ISOLATION
LAYER
606

OXIDE
650

STORAGE
NODE
622

CELL
620

IPD LAYERS
624

CHANNEL
630

CONTROL
GATE
626

DIELECTRIC
FILL
632

ISOLATION
LAYER
604

CELL
610

IPD LAYERS
614

STORAGE
NODE
612

CONTROL
GATE
616

ISOLATION
LAYER
602

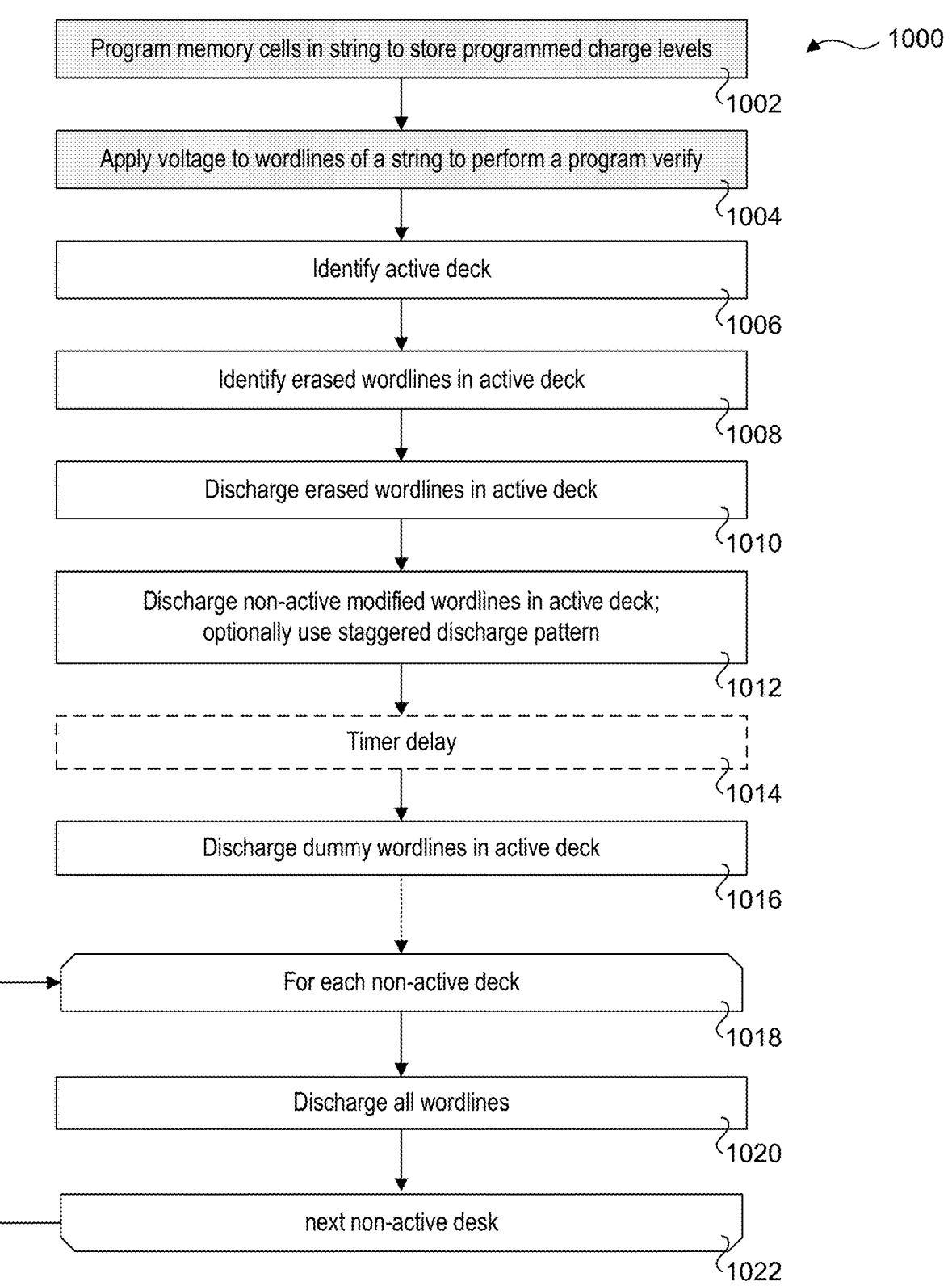

Program memory cells in string to store programmed charge levels
1002

Apply voltage to wordlines of a string to perform a program verify
1004

Identify active deck
1006

Identify erased wordlines in active deck
1008

Discharge erased wordlines in active deck
1010

Discharge non-active modified wordlines in active deck; optionally use staggered discharge pattern
1012

Timer delay
1014

Discharge dummy wordlines in active deck
1016

For each non-active deck
1018

Discharge all wordlines
1020 next non-active desk
1022

FAST AND EFFICIENT VERIFY RECOVERY AND ARRAY DISCHARGE FOR 3D NAND MEMORY ARRAYS

BACKGROUND INFORMATION

Solid state storage devices (for example, solid state drives or SSDs) may be comprised of one or more packages of non-volatile memory dies implementing NAND memory cells, where each die is comprised of storage cells, where storage cells are organized into pages and pages are organized into blocks. Each storage cell (also referred to as a memory cell) can store one or more bits of information. The different cells may be programmed to one or more voltages by applying a series of pulses to have selected cells reach a desired voltage level.

Three-dimensional (3D) NAND memory refers to NAND memory in which a NAND string may be built vertically so that storage cells (also referred to as memory cells) of the string are stacked on top of one another. 3D NAND and other 3D architectures are attractive in part due to the significantly higher bit densities that can be achieved relative to two-dimensional (2D) architectures. 3D NAND memory devices have one or more decks comprising tiers of circuit elements that are stacked on top of one another. The circuit elements are connected via channels in vertical structures (e.g., memory holes or pillars) having high depth to width aspect ratios (AR).

In NAND memory arrays, a sequence of pulses is applied to selected memory cells to inject a level of charges in the memory cells. Each pulse is followed by a series of verifies to check that each cell has trapped the desired charge level. Once a cell has passed the verify corresponding to the desired programming level for the cell, that cell is inhibited from additional charge injections in the following pulses. After the sequence of verifies of a certain pulse is concluded, preparing for the next pulse involves a series of array cleaning operations to discharge electrons from the array to prevent effective channel boosting loss and undesired hot carrier injection on cells that are to be inhibited.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 10 is a flowchart illustrating a program-verify-discharge workflow using fVRCV, accordingly to one embodiment;

DETAILED DESCRIPTION

Figure 1:
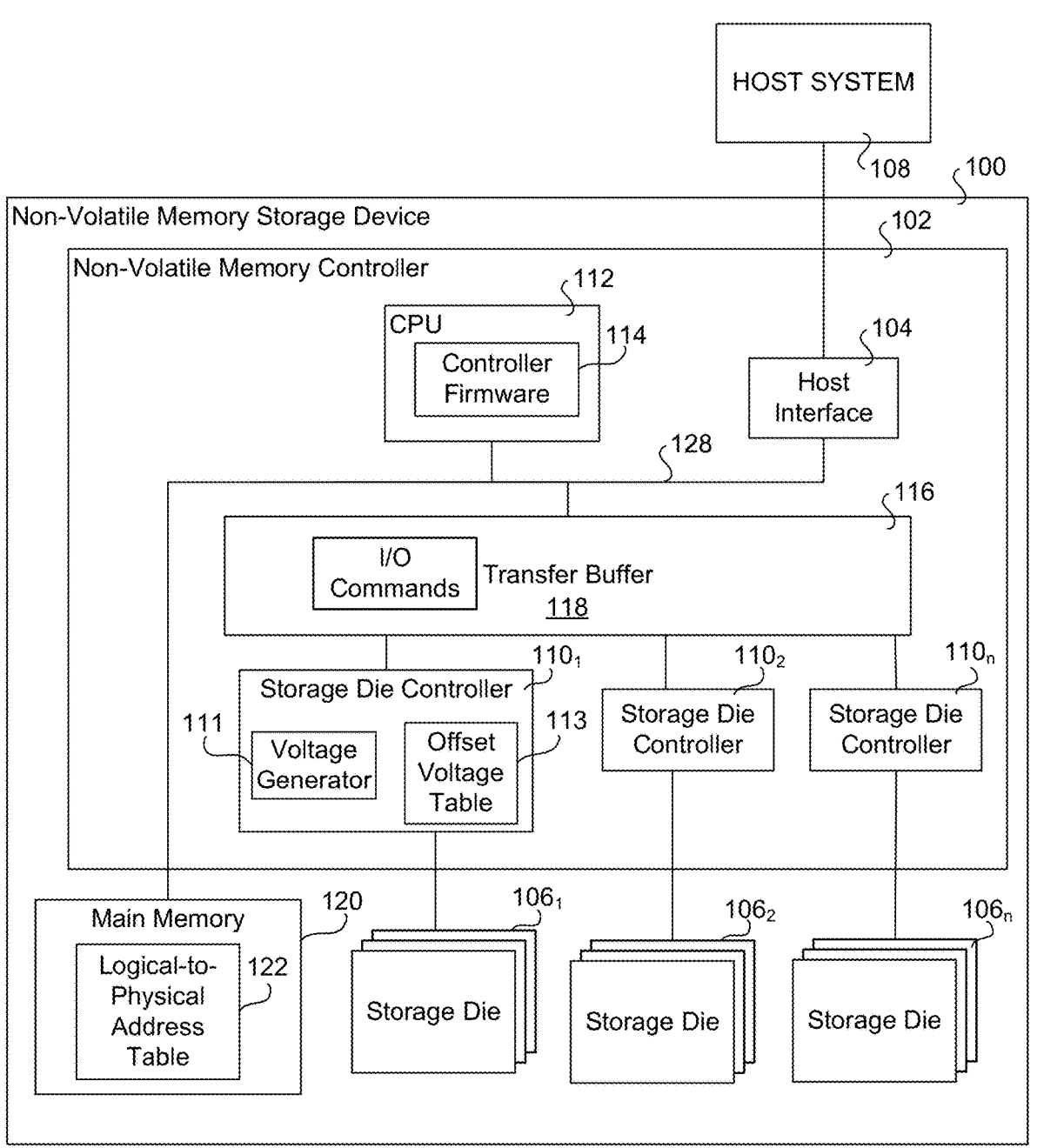
FIG. 1 is a diagram illustrating a non-volatile memory storage device, according to one embodiment.

Embodiments of methods and apparatus for fast and efficient verify recovery and array discharge for 3D NAND memory arrays are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

In certain verify recovery implementations, after verifying the voltages in the memory cells to which electrons were injected, preparing for the next pulse involves a series of array cleaning operations to prevent effective channel boosting loss and undesired hot carrier injection on cells that are to be inhibited. This cleaning may also be followed by array seeding to equalize the potential in the array. Finally, a bitline separation and elaboration is performed, in which bitlines are used to individually either enable or disable additional charge trapping/programming on various cells.

The cleaning operation to discharge electrons from the memory cells is to clear electrons that can cause issues in subsequent array operations. For example, these electrons trapped in the channel can move to the neighboring program voltage (V pgm) wordline during a next program (pgm) pulse and degrade the boosting window. A degraded boosting window can cause program disturb or the inadvertent programming of a memory cell. In one example, program disturb results in the mis-programming of a memory cell level with Fowler-Nordheim tunneling due to an overabundance of electrons in the channel of a memory cell being programmed or inhibited.

The preparation for a next pulse operation to further program cells required to be programmed to a higher voltage level involves three phases that occur sequentially, a verify recovery, seeding, and bitline separation and stabilization. During the verify recovery phase the memory array is cleaned from electron puddles in the array that would result in undesired charge injection of inhibited cells in the next pulse. This phase may involve applying an intermediate passing voltage (VPass) on the array or staggering the potential from a passing voltage to the ground across the array, or any part of the array, one wordline after another including the selected wordline to discharge the electron puddles. During the seeding phase, the entire array is grounded or taken to a low voltage and then only the select wordline and select gates are taken to a passing voltage while the pillar is biased to a bit of electrons in. The purpose of this is to make sure the pillar is not at a negative voltage due to the possible excessive cleaning from verify recovery. The negative voltage may cause hot carrier injection in the next pulse. During the bitline separation and stabilization phase, the outcome of the verifies is processed and cells that should be inhibited are known and they are added to the inhibit pool. Selected bitlines and inhibited bitlines are taken to the destination voltages (ground or supply) and given time to stabilize to make sure inhibited bitlines have reached the supply voltage ($V_{cc}$) and the select junction is shut down.

The above implementation of the verify recovery operation into three consecutive phases can take considerable time, especially during a staggered discharge operation as the number of wordlines increase in ever denser arrays and during the bitline separation and stabilization phase as the number and length of the bitlines increases in ever denser arrays.

FIG. 1 illustrates an embodiment of a non-volatile memory storage device 100 having a non-volatile memory controller 102, including a host interface 104 to transfer blocks of data and I/O commands between a plurality of groups of storage dies 106 1, 106 2 . . . 106 n, comprising a non-volatile memory of storage cells that may be organized into pages of storage cells, where the pages are organized into blocks, and a connected host system 108. The non-volatile memory storage device 100 includes storage die controllers $110_1$, $110_2$ . . . $110_n$ that manage read and write requests to blocks of data in pages of storage cells to groups of the storage dies $106_1$, $106_2$ . . . $106_n$ and the transfer of data between the transfer buffer 116 and the storage dies $106_1$, $106_2$ . . . $106_n$. The storage die controllers $110_1$, $110_2$ . . . $110_n$ may include, as shown with respect to storage die controller $110_1$, a voltage generator 111 to generate voltages and an offset voltage table 113 providing different offset voltages for different groups of wordlines in memory arrays formed in the storage dies $106_1$, $106_2$ . . . $106_n$ to use when discharging electrons from the memory arrays during a verify recovery operation.

A storage die $110_i$ may cause the voltage generator 111 to generate different voltages to apply to wordlines, bitlines, and other components, such as select gate drain (SGD) devices, and select gate source (SGS) devices, during read or write operations to access memory cells, to perform erase operations, and to perform verify recovery operations to prepare the memory array for a next round of pulses of program voltages (Vpgm) to further program selected memory cells to a next program level.

The non-volatile memory storage device 100 may function as both a memory device and/or a storage device (for example, a Solid-State Drive (SSD)) in a computing system, and may be used to perform the role of volatile memory devices and non-volatile storage media in a computing system. In an embodiment, the non-volatile memory storage device 100 may comprise a non-volatile memory storage device.

The non-volatile memory controller 102 may include a central processing unit (CPU) 112 implementing controller firmware 114, also referred to as a memory controller, managing the operations of the non-volatile memory storage device 100 and a non-volatile transfer buffer 116 comprising a non-volatile memory device to cache and buffer transferred Input/Output ("I/O") commands 118 and data between the host 108 and storage dies $106_1$, $106_2$ . . . $106_n$. The transfer buffer 116 may comprise a Static Random Access Memory (SRAM) or other suitable volatile or non-volatile memory storage device.

A main memory 120 stores a logical-to-physical address table 122 providing a mapping of logical addresses to which I/O requests are directed and physical addresses in the storage dies $106_1$, $106_2$ . . . $106_n$ at which the data for the logical addresses are stored. The logical addresses may comprise logical block address (LBAs) or other logical addresses known in the art.

In one embodiment, the memory device, such as including the storage dies $106_1$, $106_2$ . . . $106_n$, transfer buffer 116, and main memory 120, may comprise a block addressable memory device, such as those based on NAND or NOR technologies. A memory device may also include future generation nonvolatile devices, such as a 3D crosspoint memory device, or other byte addressable write-in-place nonvolatile memory devices. In some embodiments, 3D crosspoint memory may comprise a transistor-less stackable cross point architecture in which memory cells sit at the intersection of wordlines and bitlines and are individually addressable and in which bit storage is based on a change in bulk resistance. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferro-electric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. The storage dies $106_1$, $106_2$ . . . $106_n$, transfer buffer 116, and main memory 120 may comprise different types of memory devices. The transfer buffer 116 may comprise an SRAM; and the main memory 120 may comprise a Dynamic Random Access Memory (DRAM), which may be battery backed-up, or a 3D crosspoint memory. In certain embodiments, the main memory 120 may comprise a non-volatile memory storage device 100 of the described embodiments within another non-volatile memory storage device 100.

The host interface 104 connects the non-volatile memory storage device 100 to a host system 108. The non-volatile memory storage device 100 may be installed or embedded within the host system 108, or the non-volatile memory storage device 100 may be external to the host system. The host interface 104 may comprise a bus interface, such as a Peripheral Component Interconnect Express (PCIe) inter-face, Serial AT Attachment (SATA), Non-Volatile Memory Express (NVMe), etc.

The CPU 112, host interface 104, and transfer buffer 116 may communicate over one or more buses 128, such as a PCIe or other type of bus or interface. Data may be trans-ferred among the host interface 104, CPU 112, and transfer buffer 116 over bus 128 using Direct Memory Access (DMA) transfers, which bypass the CPU 112. Alternatively, the CPU 112 may be involved in transferring data among the host interface 104, transfer buffer 116, and storage dies $106_1$, $106_2$ . . . $106_n$ over the bus 128. In alternative embodiments the connection among any of the components 104, 112, 116, and 120 may comprise direct lines or paths and not a shared bus.

Figure 2:
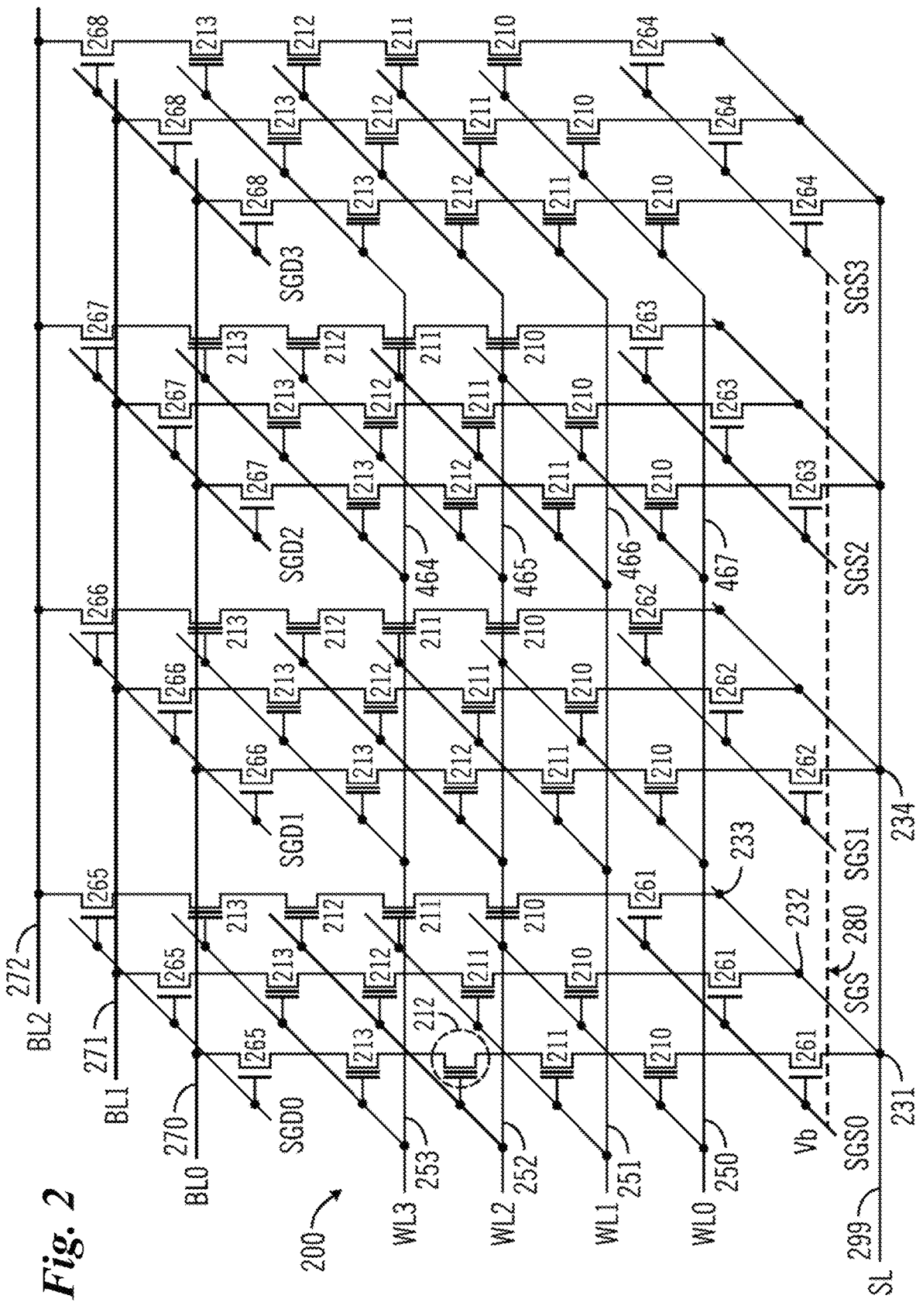
FIG. 2 is a schematic diagram of a 3D memory array.

FIG. 2 is an embodiment of a 3D memory array 200 that may be implemented in the storage dies storage dies $106_1$, $106_2$ . . . $106_n$, where there may be one or more of the memory arrays 200 implemented in each of the storage dies $106_1$, $106_2$ . . . $106_n$. The memory array includes wordlines 250, 251, 252, and 253 that carry corresponding signals WL0, WL1, WL2, and WL3 and data lines (bitlines) 270, 271, and 272 that carry signals BL0, BL1, and BL2, respec-tively. Four wordlines 250, 251, 252, and 253 and three bitlines 270, 271, and 272 are shown in FIG. 2 as an illustrative example only. The number of these lines may vary. Memory array 200 may include memory cells 210, 211, 212, and 213, and transistors 261 through 268. The memory cells 210, 211, 212, and 213 and transistors 261 through 268 may be arranged in memory cell strings, such as memory cell strings (pillars) 231, 232, and 233. For simplicity, in FIG. 2, only three of the memory cell strings (pillars) are labeled (231, 232, and 233). The memory array 200 shown in FIG. 2 includes nine memory cell strings and four memory cells 210, 211, 212, and 213 in each memory cell string (pillar).

The example memory array 200 shown in FIG. 2 is provided for illustrative purposes and is not limiting to this disclosure. One skilled in the art will appreciate that the number of access lines, number of memory cell strings (pillars), and number of memory cells in each memory cell string may vary.

Memory cells 210, 211, 212, and 213 may be physically located in multiple levels of the memory array 200, such that memory cells 210, 211, 212, and 213 in the same memory cell string may be stacked over each other in multiple levels of memory array 200, forming a pillar. As shown in FIG. 2, transistors 261 through 268 and may be controlled (e.g., turned on or turned off) by corresponding signals SGD0, SGD1, SGD2, and SGD3, and SGS0, SGS1, SGS2, and SGS3 provided via corresponding lines as shown to couple the memory cell strings to their respective bitlines 270, 271, and 272, and a line 299, during a memory operation, such as a write operation. In some embodiments, depending on a desired memory array 200 configuration, the lines carrying signals SGS0, SGS1, SGS2, and SGS3 may be connected via a common SGS line 280, as shown.

Source line (SL) 299 may include a common source line of memory array 200 and may carry a signal, such as signal SL. In a memory operation, such as a write operation, different voltages may be applied to wordlines 250, 251, 252, and 253 by the voltage generator 111 to selectively access memory cells 210, 211, 212, and 213 in order to store information into one or more selected memory cell among memory cells 210, 211, 212, and 213. For example, in a write operation, memory array 200 may select memory cell 212 (shown within a dashed circle) of memory cell string 231 to store information into memory cell 212. In this example, memory array 200 may apply a voltage to wordline 252 and other voltages to wordlines 250, 251, and 253. The voltage on wordlines 250, 251, and 253 may have the same or different values.

In embodiments, the memory array 200 may comprise one or more memory blocks disposed in the storage dies $106_1$, $106_2$ . . . $106_n$. A memory block may have different memory capacities, depending on technological demand. For simplicity purposes, the memory array 200 illustrated in FIG. 2 illustrates a memory block that includes four sub-blocks defined respectively by SGD0, SGD1, SGD2, and SGD3. In operation, such as when a memory array is to be accessed for programming (or data reading), a memory block may be selected (e.g., for programming) or deselected, in order to refrain from programming while other block(s) are being programmed. Accordingly, in a memory array having a plurality of memory blocks, at least one block may be selected for access (e.g., for a program mode or read mode), while other blocks may be deselected in order to refrain from access. Selection and deselection of memory blocks may be accomplished by application of particular voltage values to respective wordlines and SGS lines.

The offset voltage table 113 may specify different voltage offsets to use for different groups of wordlines 250, 251, 252, and 253 that are used to determine the discharge voltage to apply to a group of wordlines to discharge electrons during the verify recovery phrase. The offset voltages may be determined empirically during development of the memory device to determine the amount of discharge voltage that minimizes undesired carrier injection and high electrostatic fields that remain in the memory array 200 after the verify recover phase that negatively impact pulse generation opera-tions to program the memory cells.

In some examples, each memory cell 210, 211, 212, 213 can be programmed according to various encoding schemes such as SLC (single level cell), MLC (multi-level cell) TLC (triple level cell), QLC (quad level cell), PLC (penta level cell) or other encoding scheme. Each cell's threshold voltage (Vt) is indicative of the data that is stored in the cell.

A programming sequence for a group of cells may include programming all of the intended pages into the group of cells. A programming sequence may include one or more programming passes. A programming pass (which may include one or more programming loops) may program one or more pages. A programming pass may include the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). The application of an effective program voltage (Vpgm) to a cell may include changing the voltage difference between a control gate and a channel of the cell in order to change the threshold voltage of the cell. Accordingly, a voltage of a wordline 250, 251, 252, 253 (coupled to the control gate of the target cell) and/or a channel of the cell may be set in order to effectuate application of an effective program voltage. As a program voltage is commonly used to refer to a voltage applied to a wordline, the effective program voltage can be the voltage difference between a control gate and channel of a cell (which in instances where the channel is held at 0 V can be synonymous with a program voltage).

Figure 3:
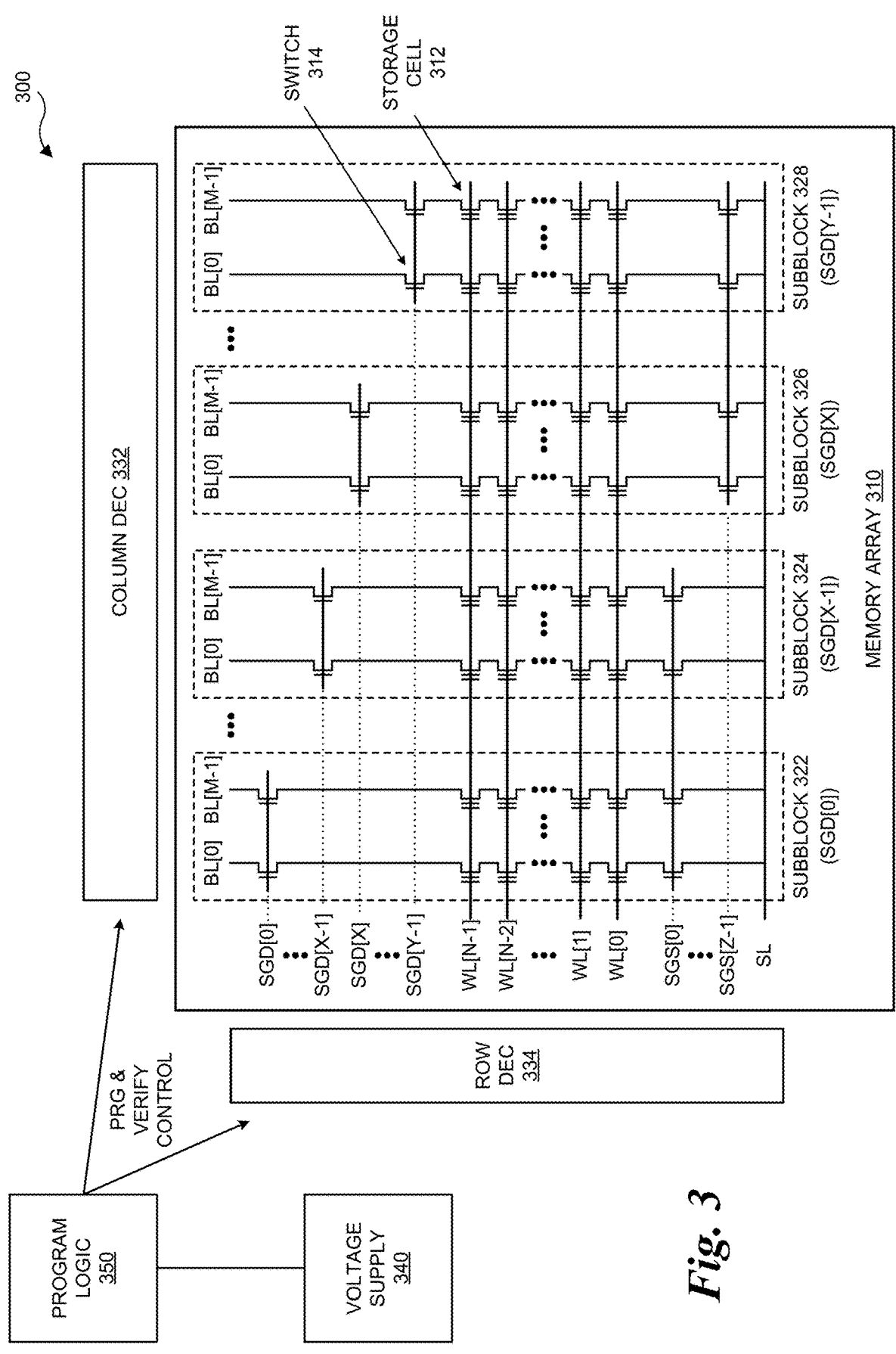
FIG. 3 is a block diagram of an example of a system having a memory device with a subblock architecture, according to one embodiment.

FIG. 3 is a block diagram of an example of a system having a memory device with a subblock architecture. System 300 represents a non-volatile storage device in which the verify recovery and array discharge schemes described below may be implemented, such as non-volatile memory storage device of FIG. 1. In one example, system is or is included in an SSD. System 300 can be integrated into a computing device.

System 300 includes memory array 310. In one example, memory array 310 represents a 3D NAND storage device. In one example, memory array 310 represents a 3D stacked memory device. Storage cells 312 represent NV storage cells. In one example, the storage cells 312 represent NAND storage cells. In one example, memory array 310 is an SLC array.

Memory array 310 includes N wordlines (WL[0] to WL[N−1]). N can be, for example, 32, 48, 64, or some other number. In one example, memory array 310 is segmented into subblocks. Subblocks 322, 324, 326, and 328 are illustrated, but are only to be understood as illustrative and not limiting. Segmentation of the memory array into different subblocks can include segmenting into any number of subblocks.

In one example, a subblock refers to the columns, pillars, or strings of storage cells 312 that are accessed together. The pillars or vertical channels can be accessed together by responding to a common switching signal. The switching signal can refer to gating control for the pillar. For example, the various pillars can be controlled by select gate drain (SGD) signal lines and select gate source (SGS) signal lines. Switches 314 represent the switching elements that can selectively apply the SGD and SGS signaling. An SGD signal line selectively couples a column to a bitline (BL). An SGS signal line selectively couples a column to a source line (SL). The source line (SL) can be a source layer of material integrated onto a semiconductor substrate.

In one example, each subblock includes M bitlines (BL[0] to BL[M−1]). In one example, each storage cell 312 within memory array 310 is addressed or selected by asserting a wordline and a bitline, in conjunction with enabling the column with the gate select switches 314 (shown only on SGD, but SGS switches can be considered included in the control).

As illustrated, memory array 310 includes SGD[0] to control selection of columns in subblock 322, SGD[X−1] to control selection of columns in subblock 324, SGD[X] to control selection of columns in subblock 326, and SGD[Y−1] to control selection of columns in subblock 328. In one example, multiple subblocks share a common source selection. Thus, for the Y SGD signal line illustrated, there are only Z SGS signal lines (SGS[0] to SGS[Z−1]), where Z is understood to be less than Y. In one example, memory array 310 includes the same number of SGS signal lines as SGD signal lines. In the illustrated embodiment, SGD is segmented to provide separate control for the different subblocks, with one SGD segment per subblock. Likewise, SGS is segmented, with one SGS segment providing control for multiple subblocks.

System 300 includes column decode circuitry (column DEC) 332 as a column address decoder to determine from a received command which bitline or bitlines to assert for a particular command. Row decode circuitry (row DEC) 334 represents a row address decoder to determine from a received command which wordline or wordlines to assert for the command.

Power for system 300 is received from voltage supply 340. Voltage supply 340 represents one or more voltage sources or voltage levels generated within system 300 to power electronic components of an electronic device, which can include system 300. Voltage supply 340 can generate different voltage levels, either as multiple voltage levels from a single voltage supply, or different voltage levels from different voltage supplies. Voltage supply 340 can generate multiple program voltages.

System 300 includes circuitry to apply different voltage levels to different layers of the column stack. In one example, column decode 332 and row decode circuitry 334 provide circuitry to apply the various voltages to the various columns and layers of the stack. System 300 can include other circuitry to apply the voltages to the different signal lines or layers of the stack. For example, system 300 can apply high or low voltage levels to the select lines (e.g., SGS, SGD) or to various WLs, or to a combination of wordlines and select lines. The application of the voltages to the select lines can determine whether the switches are open or closed, thus selectively deselecting (open switches) or selecting (closed switches) the columns. The application of voltage to the WLs can determine whether the individual storage cells 312 receive charge, provide charge, or are shut off from the charge.

In one example, system 300 includes program logic 350 coupled to voltage supply 340. Program logic 350 represents logic executed by a media controller or controller of the memory device to program storage cells 312.

Figure 4:
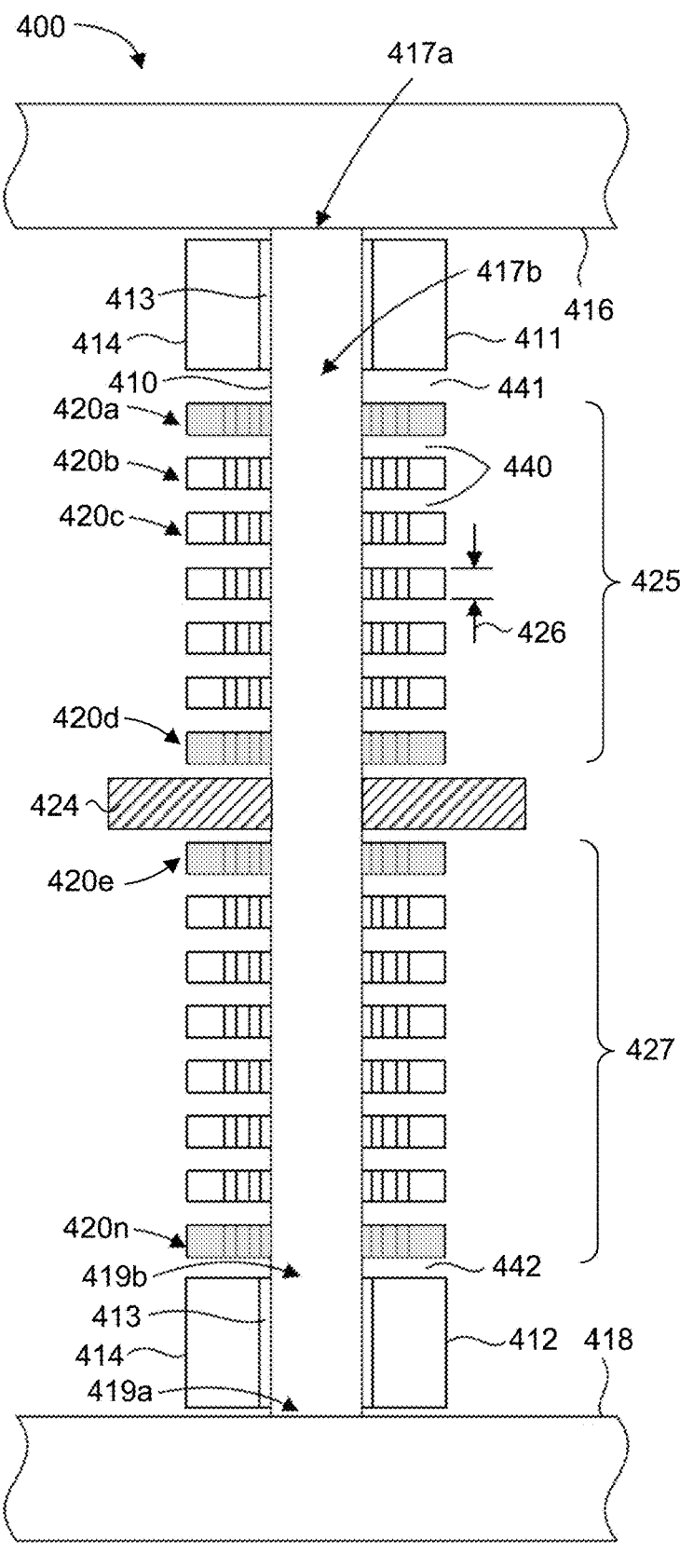
FIG. 4 is a diagram illustrating an abstracted representation of a portion of a solid-state memory component, according to one example.

FIG. 4 shows an abstracted representation of a portion of a solid-state memory component 400, according to one example. In general, the portion of the solid-state memory component includes a memory pillar 410 and memory cells 420a-n (i.e., strings 425 and 427 of memory cells, which are two physical strings comprising one electrical string) located adjacent to the memory pillar 410. Strings 425 and 427 are located in respective decks separated by inter-deck 424, which may also be referred to as a plug. Memory pillar 410 may also be referred to as a "memory hole" or "pillar hole" in some embodiments. Any suitable number of memory cells can be included. The memory pillar 410 can act as a channel region for the memory cells 420a-n, which can be coupled in series. For example, during operation of one or more of the memory cells 420a-n of the string, a channel can be formed in the memory pillar 410. The memory pillar 410 and the string of memory cells 420a-n can be oriented vertically, such as in a 3D memory array. For example, memory cell 420a is located at a vertical level (e.g., near the top of the memory array) that is above a vertical level (e.g., near the bottom of the memory array) at which memory cell 420n is located. Generally, memory cells 420a-n can have any suitable structure. A simplified memory cell structure is provided for context and by way of an example. Therefore, it should be recognized that suitable memory cell structures can vary from the memory cell structure shown in FIG. 4.

Figures 5, 6:
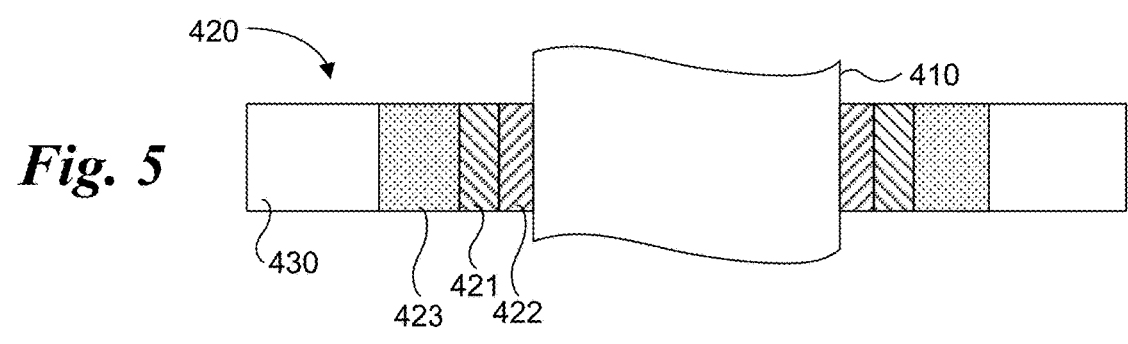
FIG. 5 is a diagram illustrating a simplified structure of a memory cell implemented in the solid-state memory component of FIG. 4.
FIG. 6 is a diagram representing a cross-section view of a portion of a vertical channel in a 3D memory structure, according to one embodiment.

Each memory cell 420a-n in this example can have a charge-storage structure (e.g., that may be a conductive floating gate, a dielectric charge trap, etc.). For example, as shown in FIG. 5, which illustrates a cross-section side view, memory pillar 410 and a representative memory cell 420, the memory cell 420 can have a charge-storage structure 421. Each memory cell 420a-n can also have a tunnel dielectric interposed between its charge-storage structure and the channel in memory pillar 410. For example, the memory cell 420 can have a gate dielectric 413 interposed between the charge-storage structure 421 and the memory pillar 410. In addition, each memory cell 420a-n can have a control gate (e.g., as a portion of or coupled to access lines, such as word lines). For example, the memory cell 420 can include a control gate 430. Each memory cell can have one or more dielectric materials or dielectric layers interposed between its charge-storage structure and the control gate. For example, memory cell 420 can include dielectric layer 423 interposed between the charge-storage structure 421 and the control gate 430 referred elsewhere in the text as inter-poly dielectric (IPD).

Each memory cell 420 may be a non-volatile memory cell and may have a charge-storage structure 421, such as a floating gate that may be a semiconductor (e.g., polysilicon), a charge trap layer that may be a dielectric film, etc. Non-limiting examples of dielectrics that are suitable for charge traps include nitrides, high-dielectric constant (high-K) dielectrics, such as alumina ($Al_2O_3$) having a K of about 10, with embedded conductive particles (e.g., nano-dots), such as embedded metal particles or embedded nano-crystals (e.g., silicon, germanium, or metal crystals), a silicon rich dielectric, or $SiON/Si_3N_4$. Embodiments of floating-gate and charge trap cells are described and illustrated below.

With further reference to FIG. 4, a dielectric 440 (also called an isolation layer) may be interposed between successively adjacent memory cells 420a-n in strings 425 and 427. For example, a dielectric 440 may be interposed between at least the charge-storage structure 421, the dielectric 423, and the control gates 430 of successively adjacent memory cells 420a-n. A dielectric 441 may be interposed between an end (e.g., between memory cell 420a) of strings 425, 427 and the select gate 411, and a dielectric 442 may be interposed between an opposite end (e.g., between memory cell 420n) of strings 425, 427 and the select gate 412, as shown in FIG. 4.

In some embodiments, where the charge-storage structure 421 is a charge trap, the tunnel dielectric 422, the charge-storage structure 421, and the dielectric 423 can form a continuous structure that can be shared by (e.g., that may be common to) two or more of the memory cells 420a-n. For example, such a structure can be shared by or common to all of the memory cells 420a-n.

Each of the memory cells 420a-n can have a thickness (e.g., a channel length) 426. For example, the memory cells 420a-n can have the same channel length regardless of where in strings 425, 427 the memory cells are located. In some embodiments, at least one channel length of a memory cell can be different from another channel length of another memory cell.

Each memory cell 420a-n of strings 425, 427 can be coupled in series with and can be between a select gate (e.g., a drain select gate) 411 adjacent to (e.g., in contact with) the pillar 410 and a select gate (e.g., a source select gate) 412 adjacent to (e.g., in contact with) the pillar 410. For a functional memory pillar, the pillar 410 is electrically coupled to a data line (e.g., a bit line 416), indicated at 417a and 417b. Thus, the select gate 411 can selectively couple strings 425, 427 to the data line (e.g., the bit line 416). In addition, for a functional memory pillar, the pillar 410 is electrically coupled to a source line 418, indicated at 419a and 419b. Thus, the select gate 412 can selectively couple strings 425, 427 to the source line 418. For example, the select gate 411 can be coupled in series with memory cell 420a, and the select gate 412 can be coupled in series with memory cell 420n. The select gates 411 and 412 can each include a gate dielectric 413 adjacent to (e.g., in contact with) pillar 410 and a control gate 414 adjacent to (e.g., in contact with) a corresponding gate dielectric 413.

FIG. 6 shows a circuit 600 that represents a portion of a vertical channel in a 3D memory structure, such as a 3D NAND array. Circuit 600 is not necessarily to scale and illustrates non-limiting example of features rather than providing an exact representation of features. Also, the shape of some of the cell structures are simplified for illustrative purposes.

Circuit 600 depicts two memory cells, cell 610 and cell 620 and three isolation layers 602, 604, and 606 (which may also be called separation layers). Although circuit 600 is not necessarily to scale, the isolation layers between the cells are generally thinner than the cells themselves. The cells illustrate one example of a memory cell structure, with semiconductor indicated as storage node 612 and storage node 622, respectively. Storage node 612 is separated from control gate poly by one or more IPD (inter-poly dielectric) layers 614. The conductor layer poly is a layer of conductor to control access to the storage node. The conductor layer poly for storage node 612 is represented as control gate 616. Likewise, storage node 622 is separated from conductor layer poly by one or more IPD layers 624, represented as control gate 626. The number of IPD layer and the structure of those layers is not important for circuit 600, as long as the storage node is electrically isolated from the conductor layer.

In one example, circuit 600 includes a tunnel oxide 650 and a channel conductor 630 with a dielectric fill 632. 3D NAND typically uses polycrystalline (poly) material for channel 630, such as but not limited to polycrystalline silicon (also referred to as polysilicon). In one example, channel 630 may be p-type or n-type doped poly.

FIGS. 4 and 5 illustrate examples of ideal structures in which memory holes/pillars have perfectly straight sidewalls (i.e., constant diameter) and the thicknesses of dielectric layers remain the same from the top to the bottom of the memory holes/pillars. The aspect ratios (height to width or hole depth to hole diameter) are reduced in FIG. 4 for illustrative purposes and clarity—the aspect ratio in actual devices is greater, as are the number of cells and associated wordlines.

Generally, it is not possible or practical to form memory holes with high aspect ratios that have perfectly straight sidewalls. Rather, the memory holes have a slight amount of taper, with the diameter at the top of the memory hole being slightly greater than the diameter at the bottom. The memory holes are also not perfectly vertical due to process limitations. However, for illustrative purposes the structures shown in some of the schematic drawings herein illustrate idealized structures.

Fabricating memory cells in 3D memory devices having high AR vertical structures poses significant challenges. For example, as the number of memory tiers increase and the depth of memory holes/pillars increases, the uniformity of the memory cell structures vary between top and bottom wordlines, leading to reliability issues. This limits memory device scaling.

One way to address high AR reliability issues is to form the memory holes/pillars in separate decks that are stacked on top of one another. Each deck comprises a stacked layer structure comprising multiple tiers, with a 2D array of memory cells interconnected with wordline circuitry in each tier.

Figure 7:
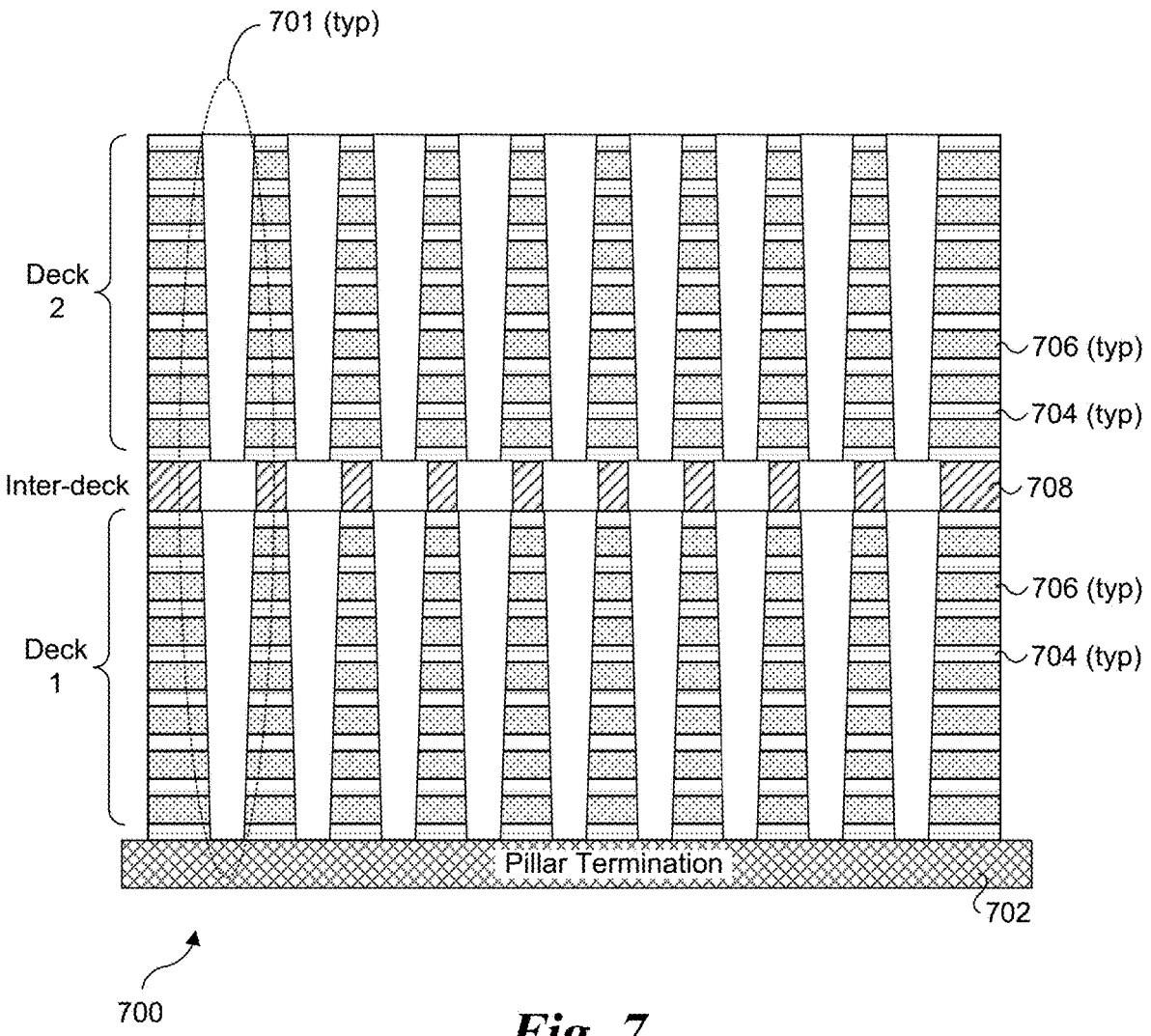
FIG. 7 is a cross-section view of a semiconductor structure including two decks of alternating tier layers after memory holes are formed, according to one embodiment.

FIG. 7 shows a 3D NAND structure 700 including two decks (Deck 1 and Deck 2) of memory tiers, with an array of memory holes 701 passing through the layers comprising the memory tiers and Decks 1 and 2. The layered structure for Deck 1 is formed of alternating isolation layers 704 and conductor (e.g., polysilicon) layers 706 disposed over a pillar termination layer(s) 702. The layered structure for Deck 2 is also formed of alternating isolation layers 704 and conductor (e.g., polysilicon) layers 706 formed over an inter-deck layer 708 that is disposed between Decks 1 and 2.

Memory holes 701 are formed using a sequence of processes. First, the alternating isolation layers 704 and conductor layer 706 for Deck 1 are formed over pillar termination layer(s) 702, following by forming inter-deck layer 708 over the top isolation layer of Deck 1. An array of memory holes is then formed passing through inter-deck layer 708 and the alternating layers of Deck 1 using a first mask having a first memory hole pattern using a first etching process or processes. The memory holes are then filled with a sacrificial film. Next, the alternating isolation layers 704 and conductor layer 706 for Deck 2 are formed over inter-deck layer 708. Memory holes are then formed to pass through the alternating isolation and conductor layers 704 and 706 of Deck 2 using a second mask having a second memory hole pattern substantially matching the first memory hole pattern and using a second etching process or etching processes. One or more subsequent etching processes are then used to remove the sacrificial film, yielding the memory hole sidewall cross-section profile shown in FIG. 7

Figure 8:
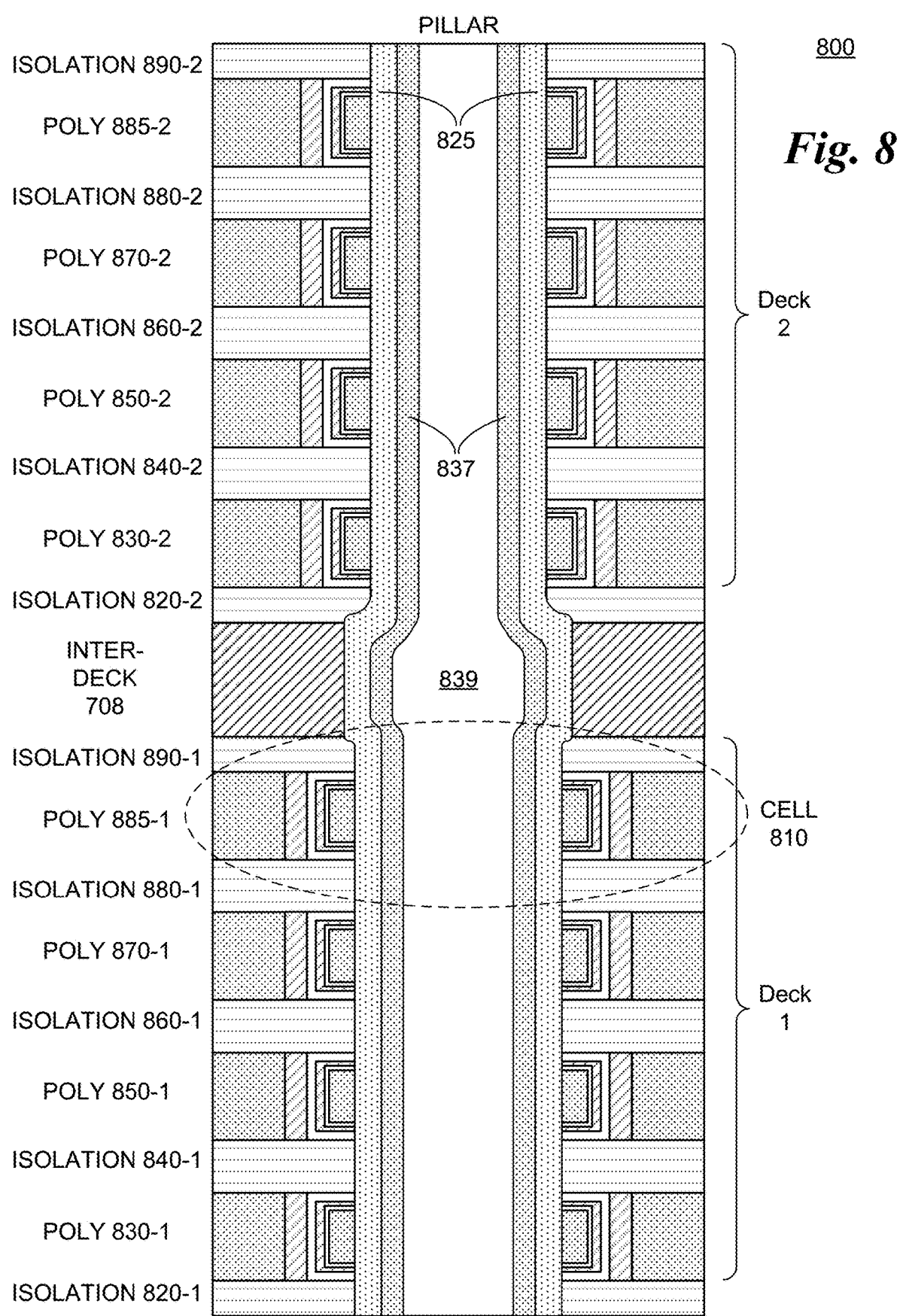
FIG. 8 is a cross-section diagram of a portion of a string of memory cells occupying portions of two decks.

FIG. 8 shows a simplified cross-section 800 of a pillar and multiple memory cells 810. For Deck 1 the layers include isolation layers 820-1, 840-1, 860-1, 880-1, and 890-1, with alternating poly layers 830-1, 850-1, 870-1 and 885-1. Similarly, for Deck 2 the layers include isolation layers 820-2, 840-2, 860-2, 880-2, and 890-2, with alternating poly layers 830-2, 850-2, 870-2 and 885-2. An inter-deck layer(s) 708 is disposed between isolation layer 890-1 and isolation layer 820-2.

A tunnel dielectric film 825 is formed over the sidewalls of the pillar hole and over which a channel conductor film is formed, as represented as channel 837. In one example, channel 37 is a lightly doped ($1e17/cm^3$-$5e17/cm^3$) polysilicon material such as n-type (electron carrier majority) or p-type (hole carrier majority) channel. The remaining portion of the pillar hole may be filled with a dielectric fill 839.

Proper array discharge is critical for effective channel boosting and program disturb prevention. Multi-deck physical array scaling makes it harder to discharge the array properly, mostly due to the addition of various barrier-like elements in the array such as plug regions between the decks (i.e., the inter-deck layers). Operational choices such as deck treatment as a separate block or the choice of programming direction with respect to source and drain exacerbate the problem even further.

Under a current discharge scheme, with state-of-the-art muti deck NAND arrays that fully utilize the technology capabilities (e.g., block-by-deck operation), it has been unavoidable to do an expensive staggered discharge, in which many WLs surrounding the selected WL as well as many interface regions are discharged one-by-one. Such an approach is costly in terms of the NAND performance and power and could be limiting to NAND scaling. Simpler designs or technologies can get by most of the times by discharging the array simply at once or the decks one-by-one; however, such designs may not utilize full capabilities of the array or limits the array operation in other ways, (e.g., no support for block-by-deck operation)

Figure 9A:
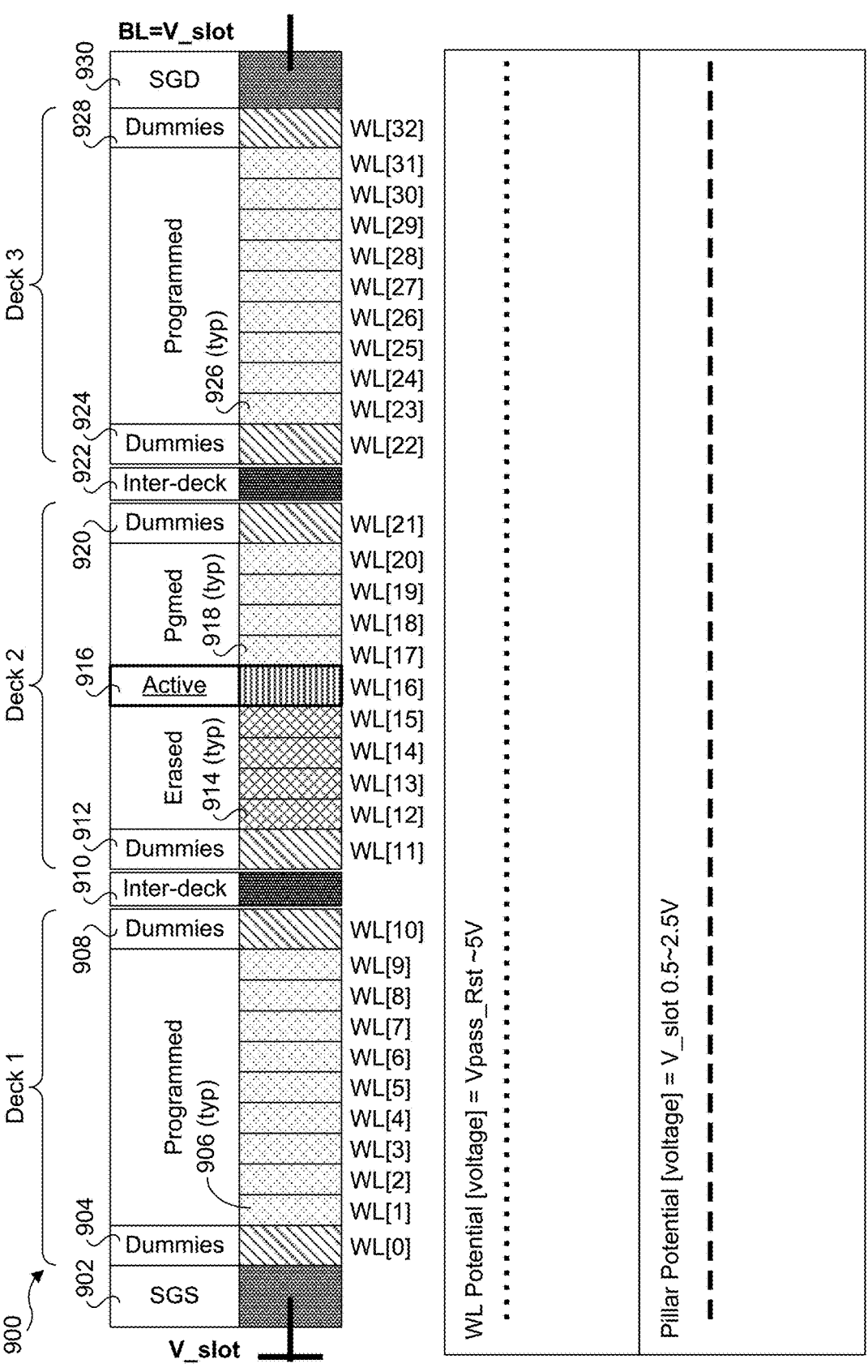
FIG. 9a is a diagram illustrating a simplified 3D NAND structure comprising 3 decks of stacked wordlines laid on its side in an upper portion and wordline potential and pillar (channel) potential voltages at different wordline locations under a baseline condition.

FIG. 9a shows a simplified 3D NAND structure 900 comprising 3 decks (Deck 1, Deck 2, and Deck 3) laid on its side. As shown, from left-to-right (corresponding to bottom-to-top), 3D NAND structure 900 includes SGS 902, a dummy tier 904 of dummy cells, programmed tiers 906 of programmed cells, a dummy tier 908 of dummy cells, an inter-deck layer(s) 910, a dummy tier 912 of dummy cells, multiple erased tiers 914 of erased cells, an active tier 916 of cells, multiple programmed tiers 918 of programmed cells, a dummy tier 920 of dummy cells, an inter-deck layer(s) 922, a dummy tier 924 of dummy cells, multiple programmed tiers 926 of programmed cells, a dummy tier 928 of dummy cells, and an SGD 930. Each of dummy tiers 904, 908, 920, 924, and 928, programmed tiers 906, 918, and 926, erased tiers 914, and active tier 916 has an associated wordline, as depicted by WL[0], WL[1] . . . WL[32]. Accordingly, the terms tiers and wordlines may be used to refer to one another. In an actual device, the number of wordlines per deck is significantly higher than shown in the Figures herein. For example, the total number of wordlines may be 200 or more in some embodiments.

Figure 9B:
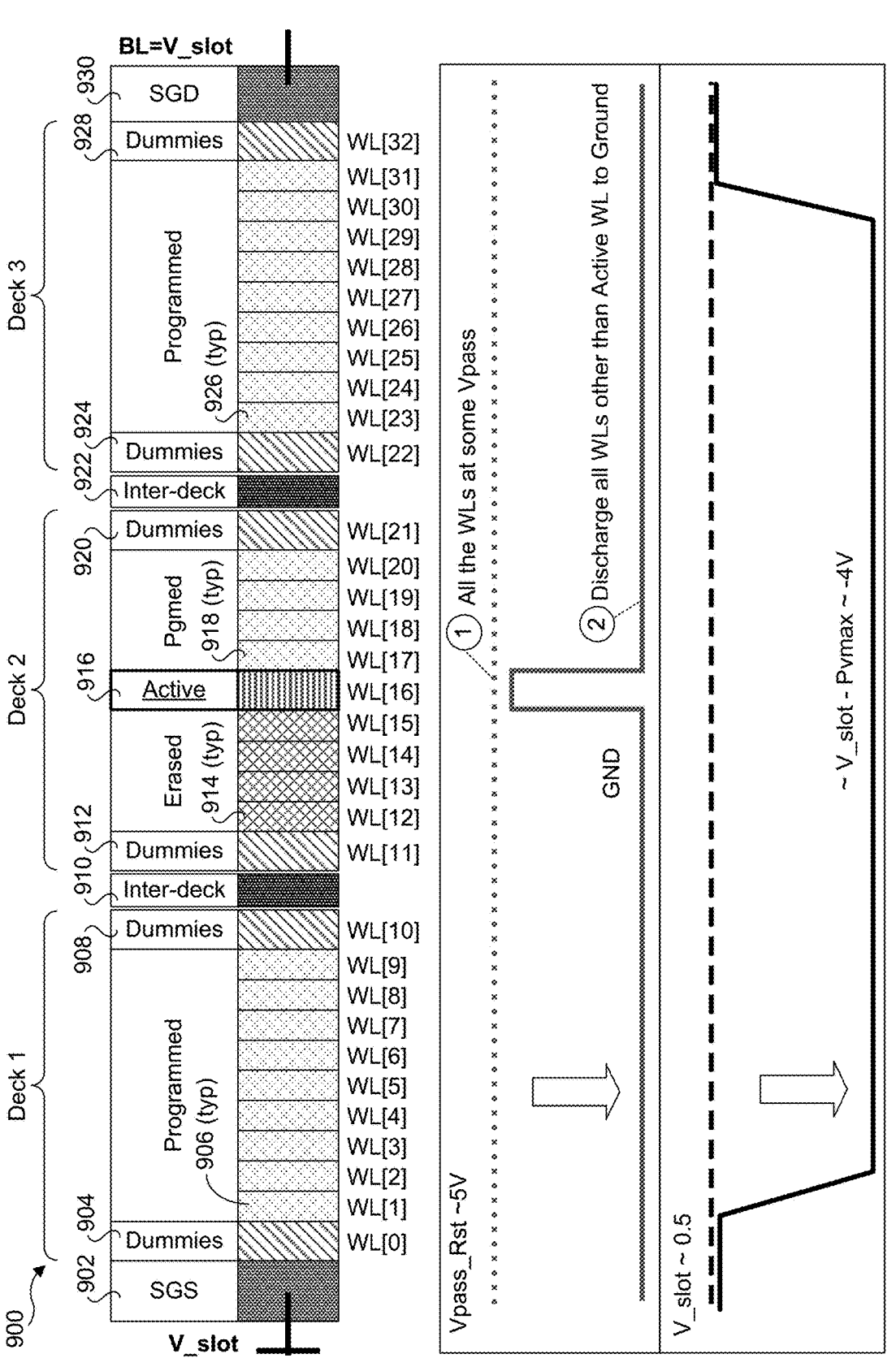
FIG. 9b shows wordline potential and pillar (channel) potential voltages at different wordline locations when discharging all wordlines other than the active wordline at once.
Figure 9C:
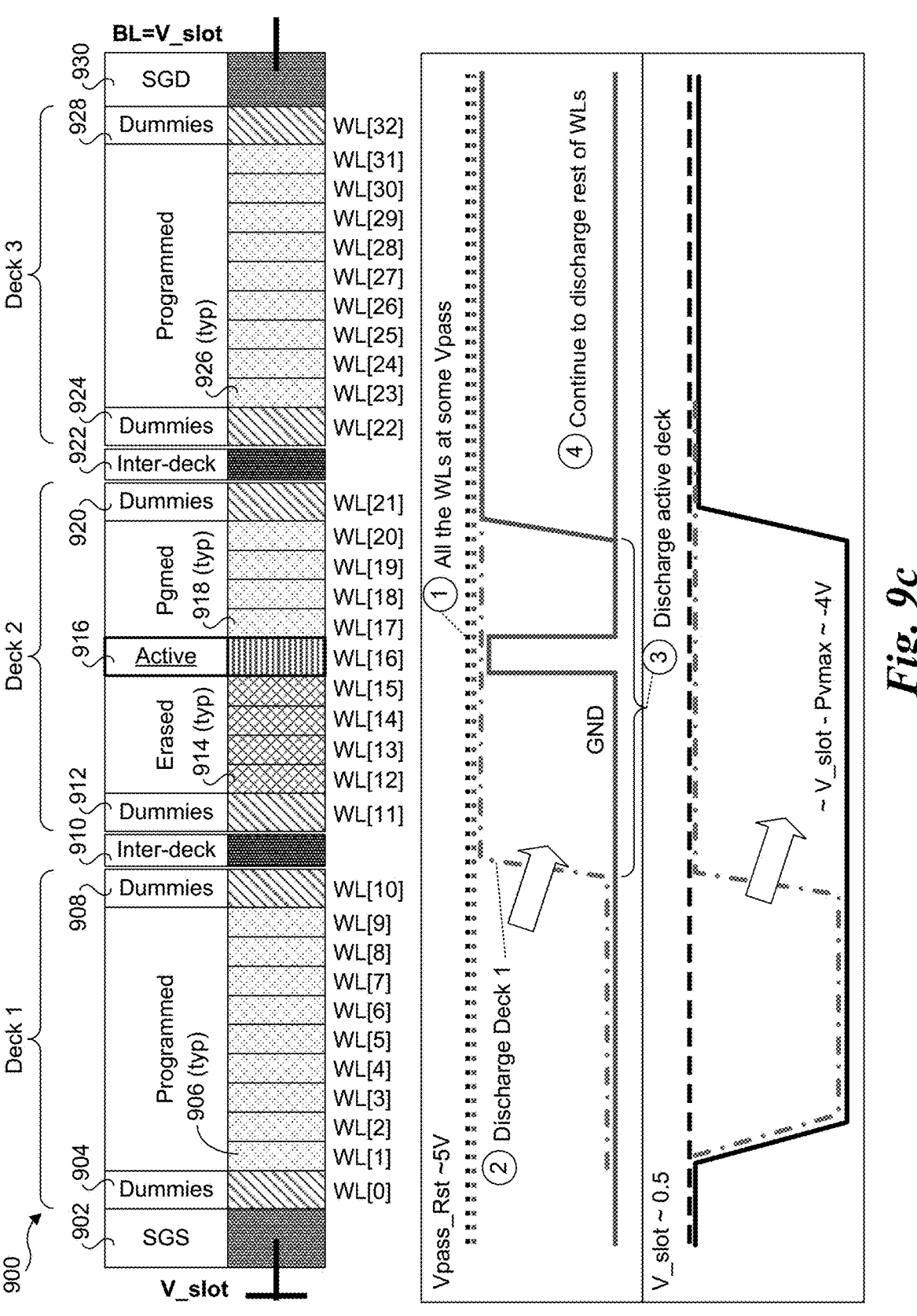
FIG. 9c shows wordline potential and pillar (channel) potential voltages at different wordline locations using a deck-by-deck discharging scheme.
Figure 9D:
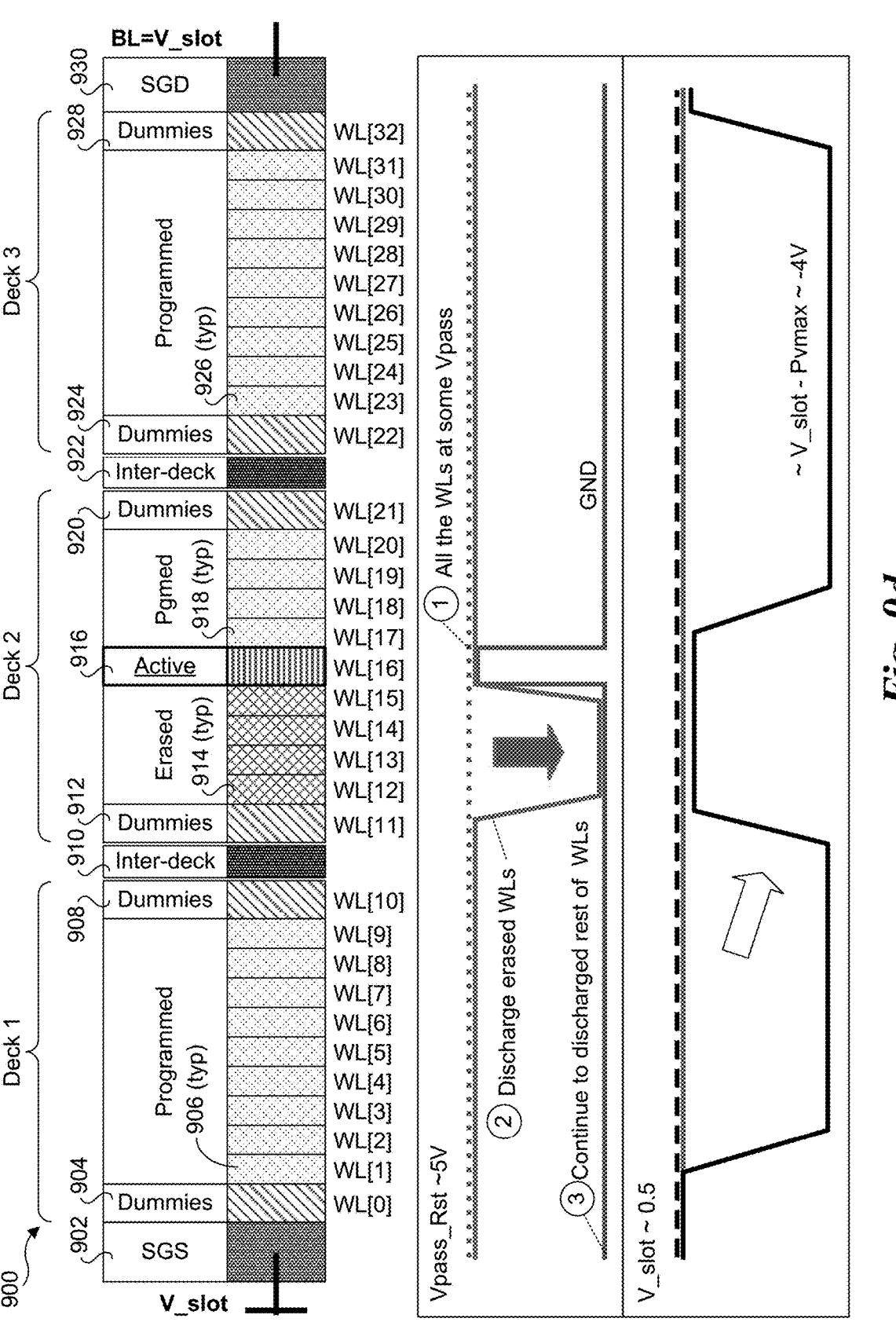
FIG. 9d shows wordline potential and pillar (channel) potential voltages at different wordline locations using a novel fVRCV (fast verify recovery) method.

Under the wordline discharge example schemes shown in FIGS. 9b, 9c, and 9d, the selected (active) wordline (active tier 916) is in an inner deck in a multi-deck array operated as a block by deck. Additionally, the page programming order is from drain to source, observing the behavior illustrated herein is general for any programming direction. In these examples, the initial voltage in the pillar channel is V_slot, which corresponds to the pillar potential voltage and has a value of approximately 0.5-2.5V. The WL potential voltage is Vpass_Rst and is approximately 5V across all wordlines. During the Vpass_Rst (Vpass reset) phase all pillars are on and the potential in the channel everywhere is the same as the slot (V_slot).

First, let us consider employing a simple all wordline discharge scheme under which all wordlines (except for the selected/active) wordlines are discharged all at once (i.e., concurrently). Under this approach the channel will be shut off at the source and drain sides, which will capacitively couple the rest of the channel to the discharging WLs, effectively taking the channel potential to negative values as shown in FIG. 9b. Another way to view this is cutting off the electrons and trapping them in the channel, which is not even a discharge process at all.

FIG. 9b shows the result of discharging all wordlines other than the active wordline at once. During a first operation comprising the Vpass_Rst phase, all wordlines are at some (Vpass_Rst) voltage, such as approximately 5V. During a second operation all wordlines other than the active wordline are discharged by connecting the wordlines to ground. As shown in the lower portion of FIG. 9b, this results in a negative channel potential of approximately −4V (~V_slot−Pvmax). As discussed above, a negative channel potential is problematic since it negates some of the subsequent boost voltage injected into the channel.

Another approach is reverse programming by deck. In this example, since programming is from drain (SGD 930) to source (SGS 902) (i.e., right to left in FIGS. 9b, 9c, and 9d), reverse programming by deck begins with the deck closest to the source (Deck 1) and proceeds to discharge the wordlines deck-by-deck (Deck 1 followed by Deck 2, followed by Deck 3). This deck-by-deck discharge example does not use discharge staggering, but rather discharges all wordlines for a given deck at once.

As illustrated in FIG. 9c, this produces a similar result to discharging all the word lines at once. As before, during a first operation comprising the Vpass_Rst phase, all wordlines are at some (Vpass_Rst) voltage, such as approximately 5V. During a second phase (operation 2), all the wordlines in Deck 1 are discharged, as depicted by the lines with a dash-dot-dash-dot pattern. When all the wordlines in Deck 1 are discharged, the channel potential for those wordlines is approximately −4V, as before. During a third phase (operation 3), the wordlines in the active deck (Deck 2) are discharged. The state of the channel potential after operation 3 is shown with the solid line, which again shows the channel potential for the portion of the channel for the wordlines in Deck 1 and Deck 2 is approximately −4V. During a fourth phase (operation 4) the rest of the wordlines in Deck 3 are discharged. When operation 4 is complete, the channel potential profile for the wordlines in all of Decks 1, Deck 2, and Deck 3 would be approximately −4V, with the voltage profile similar to that shown in FIG. 9b.

In accordance with aspect of the embodiments disclosed herein, a novel fVRCV (fast verify recovery) method and apparatus is provided. The fVRCV method spends a minor fraction of the time and energy to do the discharge and can be as effective as the complicated staggered discharge method describe above in most of the cases. Using the fVRCV method results in a reduction of the overall programming time by approximately 5-8%.

Under one embodiment, the select or active WL may be primed at the seeding voltage and should not discharge in places where hot-e and over boosting are a concern. Regardless of the choice of operating mode (block by deck or not) or programing direction, the fVRCV method begins by discharging the erased wordlines first, especially on the active deck. Those wordlines are the ones that could easily get cut off from source and drain while holding a lot of charge, and then end up boosting to a negative potential that can cause severe harm to the boosting. Following discharge of the erased wordlines, the rest of the active deck is discharged next. The plug regions surrounding the active deck (e.g., inter-deck structure) may act as barriers that prevent proper discharge of the active deck, therefore they should be turned on appropriately while the earlier step is done, and their discharge is delayed, in one embodiment.

The discharge process can be viewed as a way to prevent the channel from accumulating a negative potential that harms the boost. The fVRCV approach guarantees that while influential WLs are taken to the ground in preparation for boosting to Inhibit, the path between the channel and source and/or drain is not cut OFF. Having source and drain at a higher voltage can be used to assist the channel boost.

A program-verify-discharge workflow using fVRCV, according to one embodiment, is shown in flowchart 1000 of FIG. 10. In a block 1002, memory cells for a string are "programmed" to programmed charge levels. The operation in block 1002 is simplified to show the result of a set of memory cell programming operations under which memory cells for a block or subblock of the 3D array are programmed with a charge level or voltage using known techniques. For example, multi-level cells such as TLCs and QLCs can be respectively programmed with 8 and 16 different charge/voltage levels. Generally, the cells for a block/subblock of the 3D array will reside at the intersection of multiple wordlines (rows) and columns (e.g., pillars). While memory cells may be programmed on a row-wise or column-wise basis, it is more common to program them using a row-wise (e.g., wordline-by-wordline) scheme.

In conjunction with programming memory cells, verify operations are performed to verify that each cell has been programmed to the desired charge/voltage level. This includes applying voltage to wordlines of strings, as shown in a block 1004. The verify operations are also done using known techniques that are outside the scope of this disclosure. Due to various physical characteristics of the 3D memory cell structure, programming memory cells in a given wordline may affect the charge/voltage levels of memory cells in an adjacent layer. Thus, a programming sequence may employ a programming operation, a verify operation that observes that some cells are not at the desired programmed charge/voltage levels, an additional programming operation to adjust the charge/voltage levels in those cells, and a second verify operation to verify the programmed charge/voltage levels are correct.

The operations in blocks 1002 and 1004 are conventional operations, while the remaining operations are (collectively) novel operations in accordance with embodiments disclosed herein. In a block 1006 the active deck is identified. The active deck is the deck that includes the active wordline. In the case of a structure with a single deck, the operation of block 1006 can be skipped.

In a block 1008 the erased wordlines in the active deck are identified, and the erased wordlines for the active deck are the first wordlines to be discharged, as depicted in a block 1010. After the erased wordlines are discharged, the non-active modified wordlines in the active deck are discharged in a block 1012. Discharging of these wordlines may employ an optional staggered discharge scheme under which rather than discharging the wordlines all at once they are discharged sequentially.

Following discharge of the non-active modified wordlines for the active deck, the dummy wordlines for the active deck are discharged in a block 1016. An optional timer delay may be used between discharging the last modified wordline(s) for the active deck and initiating discharge of the dummy wordlines, as shown in a block 1014.

At the stage, all the wordlines in the active deck except for the active wordline have been discharged. As shown by start and end loop blocks 1018 and 1020 and block 1022, all the wordlines in the non-active deck or desks are then discharged. In one embodiment, the discharge of the wordlines in the non-active deck(s) is done concurrently (i.e., all at once).

An example of fVRCV is shown in FIG. 9d. As before, during a first operation comprising the Vpass_Rst phase, all wordlines are at some (Vpass_Rst) voltage, such as approximately 5V. Next, during a second operation the wordlines that are identified as erased wordlines (wordlines 914) are discharged together. Subsequently, during a third operation all the remaining wordlines except for active wordline 916 are discharged. Under one embodiment, the modified word- lines in the active deck are discharged first, followed (op- tionally), the dummy wordlines for the active deck. Subse- quently, the wordlines in the non-active deck or decks are discharged.

As shown in the lower portion of FIG. 9d, the channel potential for the erased wordlines 914 and active wordline 916 is approximately equal to V_slot (approximately 0.5V in this example). The channel potential for portions of the channel for the wordlines in Deck 1 and Deck 3 and a portion of programmed wordlines 918 in Deck 2 is approxi- mately −4V, as before.

Figure 11:
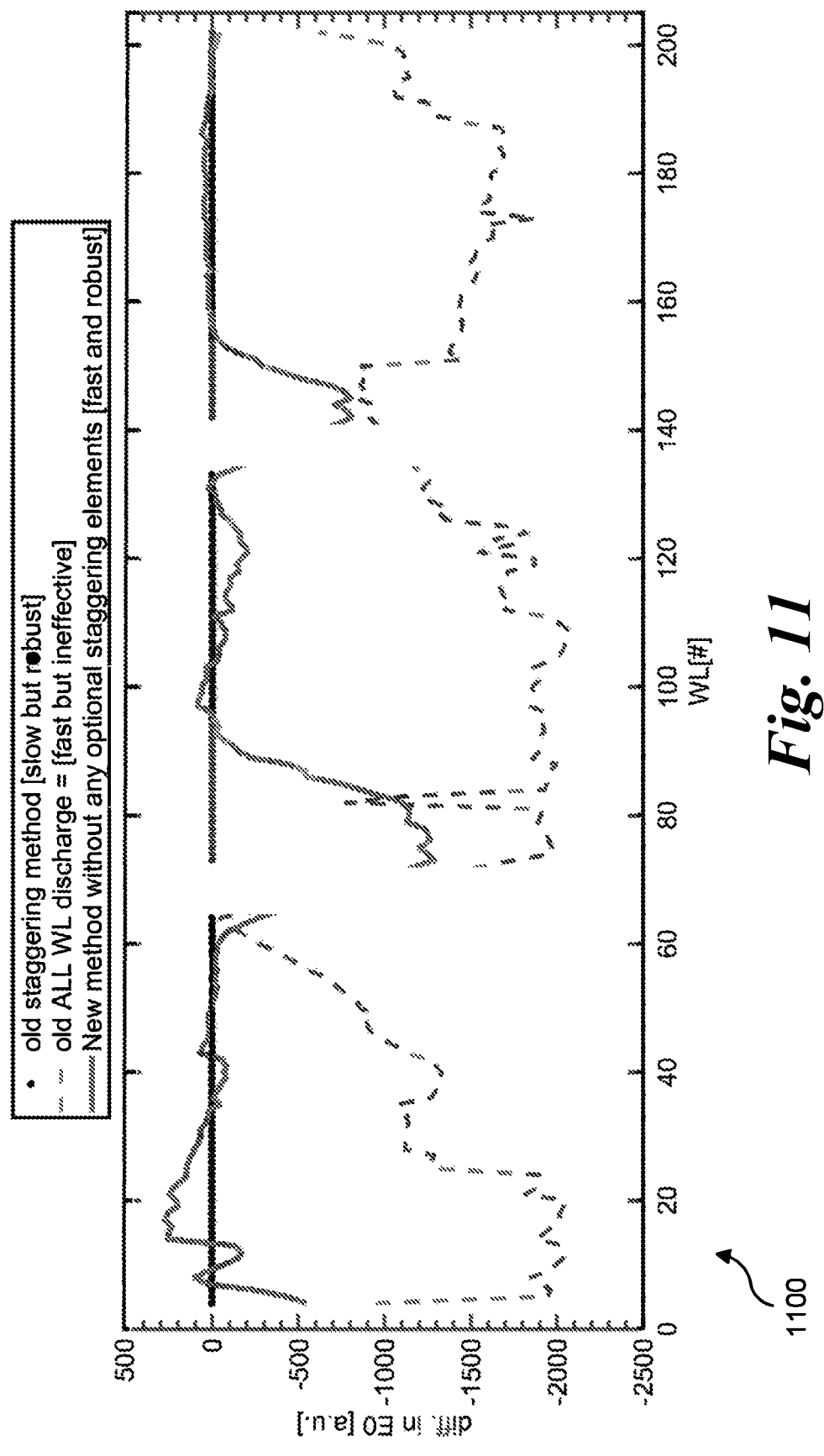
FIG. 11 is a graph comparing differences in channel potential (EO) in arbitrary units (a.u.) for the current staggered wordline discharge method, the all wordline discharge method, and the new fVRCV method without optional staggering elements.

It is noted that the channel potential voltage levels in FIGS. 9b, 9c, and 9d are simplified for illustrative purposes. When these discharge schemes are implemented in actual non-volatile 3D memory devices, the pillar potential voltage profiles vary with wordline position. For example, FIG. 11 shows a graph 1100 comparing different in channel potential (EO) in arbitrary units (a.u.) for the current staggered wordline discharge method (which produces a baseline value of 0), the all wordline discharge method, and the new fVRCV method without optional staggering elements. In this example, the 3D NAND memory structure has approxi- mately 200 wordlines in the decks. Generally, under the novel fVRCV method, wordlines with the larger channel potential differences shown in FIG. 11 are not a problem when the active wordline is separated from these wordlines as disturb mechanisms are influential only around the active wordline. For example, the fVRCV method help maintain high enough boosting voltage around the active wordline (most cases) to program memory/storage cell voltage/charge levels to the full program range. An evidence of that is having better than or as good EO margin (metric for immu- nity to disturb to erased cells) at most wordlines compared to the more expensive staggering discharge as shown in FIG. 11.

If needed, the fVRC method may employ optional dis- charge staggering for one or more groups of wordlines for some of the programming loops. This will generally improve EO margin for those marginal groups of wordlines if needed at the cost of taking some additional time in programming those wordlines. However, the amount of needed staggering is much less than the old method of fully relying on staggering discharge.

Figure 12A:
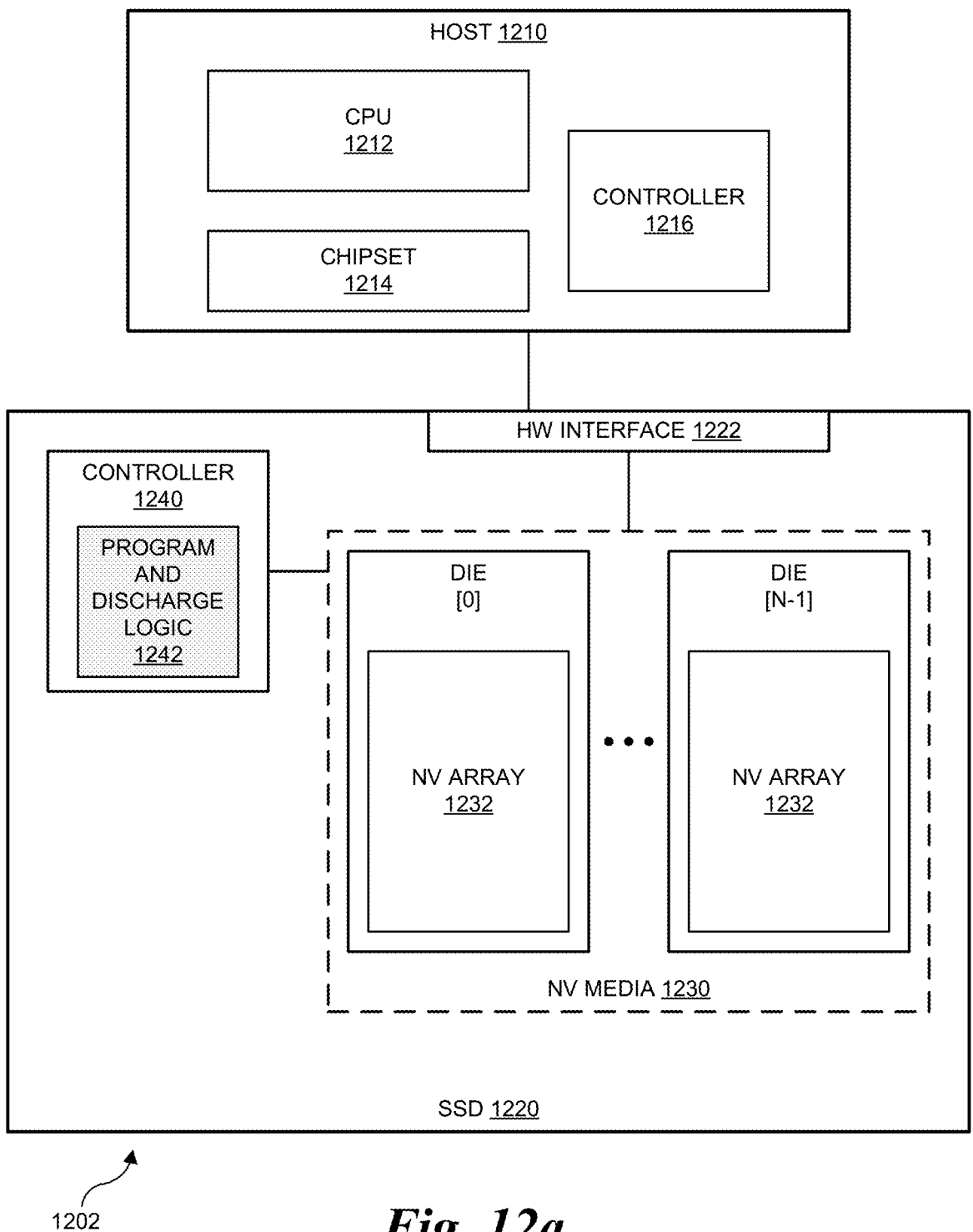
FIG. 12a is a block diagram of an example of a system with a hardware view of a solid-state drive (SSD) in which aspects of the embodiments disclosed herein may be implemented.

FIG. 12a is a block diagram of an example of a system with a hardware view of an SSD having NAND memory configured in accordance with one or more of the embodi- ments described above, including but not limited to non- volatile memory storage device 100. System 1202 includes SSD 1220 coupled with host 1210. Host 1210 represents a host hardware platform that connects to SSD 1220. Host 1210 includes CPU (central processing unit) 1212 or other processor as a host processor or host processor device. CPU 1212 represents any host processor that generates requests to access data stored on SSD 1220, either to read the data or to write data to the storage. Such a processor can include a single or multicore processor, a primary processor for a computing device, a graphics processor, a peripheral pro- cessor, or a supplemental or auxiliary processor, or a com- bination. CPU 1212 can execute a host OS and other applications to cause the operation of system 1202.

Host 1210 includes chipset 1214, which represents hard- ware components that can be included in connecting between CPU 1212 and SSD 1220. For example, chipset 1214 can include interconnect circuits and logic to enable access to SSD 1220. Thus, host 1210 can include a hardware platform drive interconnect to couple SSD 1220 to host 1210. Host 1210 includes hardware to interconnect to the SSD. Likewise, SSD 1220 includes corresponding hardware to interconnect to host 1210.

Host 1210 includes controller 1216, which represents a storage controller or memory controller on the host side to control access to SSD 1220. In one example, controller 1216 is included in chipset 1214. In one example, controller 1216 is included in CPU 1212. Controller 1216 can be referred to as an NV memory controller to enable host 1210 to schedule and organize commands to SSD 1220 to read and write data.

SSD 1220 represents a solid-state drive or other storage system or module that includes nonvolatile (NV) media 1230 to store data. SSD 1220 includes HW (hardware) interface 1222, which represents hardware components to interface with host 1210. For example, HW interface 1222 can interface with one or more buses to implement a high-speed interface standard such as NVMe (nonvolatile memory express) or PCIe (peripheral component intercon- nect express).

In one example, SSD 1220 includes NV (nonvolatile) media 1230 as the primary storage for SSD 1220. In one example, NV media 1230 is or includes a block addressable memory technology, such as NAND. In one example, NV media 1230 is implemented as multiple dies, illustrated as N dies, Die[0:{N−1}]. N can be any number of devices, and is often a binary number. SSD 1220 includes controller 1240 to control access to NV media 1230. Controller 1240 rep- resents hardware and control logic within SSD 1220 to execute control over the media. Controller 1240 is internal to the nonvolatile storage device or module, and is separate from controller 1216 of host 1210.

The NV dies of NV media 1230 include NV array 1232, which can include a 3D non-volatile memory cell array, such as a 3D NAND array. In one embodiment, NV array 1232 is divided into blocks and subblocks.

In one example, controller 1240 includes program and discharge logic 1242. Program and discharge logic 1242 is used to program memory charge and perform wordline discharge operations in accordance with one or more of the embodiments disclosed herein. In one example, SSD 1220 further includes the components and logic shown for non- volatile memory storage device 100 in FIG. 1.

Figure 12B:
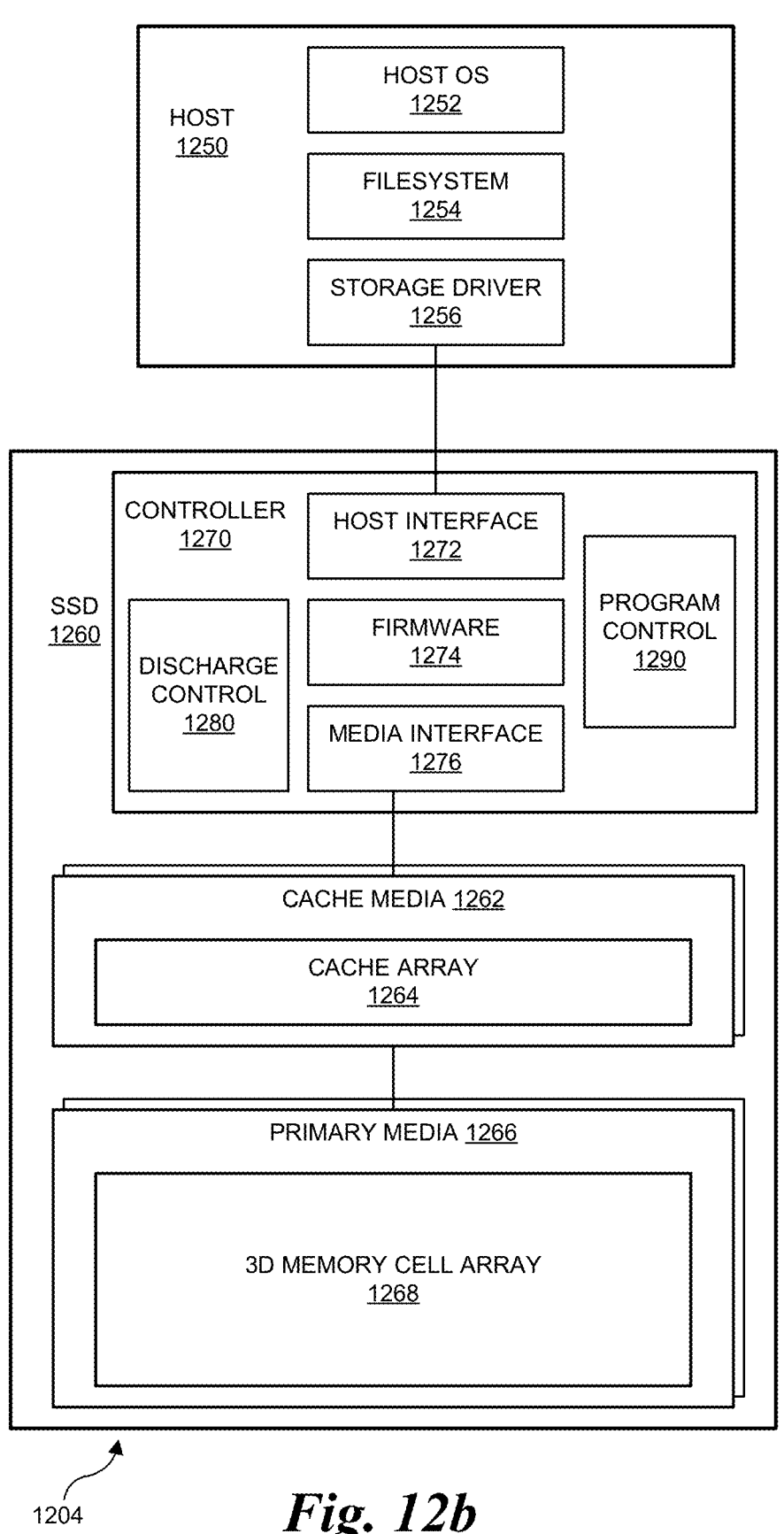
FIG. 12b is a block diagram of an example of a logical view of system with an SSD in which aspects of the embodiments disclosed herein may be implemented.

FIG. 12b is a block diagram of an example of a logical view of system with an SSD having NAND memory con- figured in accordance with one or more of the embodiments described above. System 1204 provides one example of a system in accordance with system 1202 of FIG. 12a. System 1204 illustrates the logical layers of the host and SSD of a hardware platform in accordance with system 1202. System 1204 can represent software and firmware components of an example of system 1202, as well as physical components. In one example, host 1250 provides one example of host 1210. In one example, SSD 1260 provides one example of SSD 1220.

In one example, host 1250 includes host OS 1252, which represents a host operating system or software platform for the host. Host OS 1252 can include a platform on which applications, services, agents, and/or other software executes, and is executed by a processor. Filesystem 1254 represents control logic for controlling access to the NV media. Filesystem 1254 can manage what addresses or memory locations are used to store what data. There are numerous filesystems known, and filesystem 1254 can implement known filesystems or other proprietary systems. In one example, filesystem 1254 is part of host OS 1252.

Storage driver 1256 represents one or more system-level modules that control the hardware of host 1250. In one example, drivers 1256 include a software application to control the interface to SSD 1260, and thus control the hardware of SSD 1260. Storage driver 1256 can provide a communication interface between the host and the SSD.

Controller 1270 of SSD 1260 includes firmware 1274, which represents control software/firmware for the controller. In one example, controller 1270 includes host interface 1272, which represents an interface to host 1250. In one example, controller 1270 includes media interface 1276, which represents an interface to the storage media. In one example, the storage media of SSD 1260 is divided as cache media 1262 including a cache array 1264 and primary media 1266.

Media interface 1276 represents control that is executed on hardware of controller 1270. It will be understood that controller 1270 includes hardware to interface with host 1250, which can be considered to be controlled by host interface software/firmware 1274. Likewise, it will be understood that controller 1270 includes hardware to interface with the media. In one example, code for host interface 1272 can be part of firmware 1274. In one example, code for media interface 1276 can be part of firmware 1274.

In one example, controller 1270 includes discharge control logic 1280 to implement wordline discharge method in accordance with the embodiments disclosed herein. In one example, controller 1270 includes program control 1290, which is used for programming memory/storage cells in 3D memory cell array 1268.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A storage device comprising:
a storage array including a plurality of strings of memory cells; and
a controller configured to:
program memory cells in a first string including a plurality of wordlines to store charges having programmed charge levels;
apply a voltage to at least one of the plurality of wordlines of the first string to perform a program verify;
identify a set of one or more erased wordlines of the first string; and
selectively discharge the plurality of wordlines of the first string including discharging the set of one or more erased wordlines prior to discharging a set of other wordlines, wherein a first operation of discharging the set of one or more erased wordlines is completed before a second operation of discharging the set of other wordlines.

2. The storage device of claim 1, wherein the storage array comprises a three-dimensional (3D) NAND array and the first string comprises a 3D NAND string.

3. The storage device of claim 1, comprising:
one or more decks, each deck including a plurality of stacked tiers of memory cells, each tier comprising a two-dimensional (2D) array of memory cells arranged in a first pattern and coupled to a wordline for the tier; and a 2D array of pillars passing vertically through the stacked tiers of memory cells in the one or more decks, the 2D array having a second pattern substantially matching the first pattern, wherein a first pillar includes a channel connected to at least one of a select gate source (SGS) and a select gate drain (SGD), and wherein the first string of memory cells comprises a set of memory cells sharing the first pillar.

4. The storage device of claim 1, wherein the storage device comprises one or more decks of stacked tiers of memory cells and wherein one of the wordlines is an active wordline, the controller further configured to:

for a first deck including the active wordline, discharge any erased wordlines for the first deck prior to discharging programmed wordlines for the first deck.

5. The storage device of claim 4, wherein the controller is configured to discharge at least a portion of the programmed wordlines using a staggered discharge sequence.

6. The storage device of claim 4, wherein the storage device has one or more additional decks, and the controller is configured to discharge programmed wordlines in the one or more additional decks after discharging the programmed wordlines in the first deck.

7. The storage device of claim 1, further comprising at least two dummy wordlines, wherein the controller is further configured to:

after discharging the set of one or more erased wordlines, discharge a plurality of programmed wordlines; and discharge the at least two dummy wordlines after discharging the plurality of programmed wordlines.

8. The storage device of claim 7, wherein the controller is configured to implement a time delay between completion of discharging a last of the plurality of programmed wordlines and initiating of discharging a first of the at least two dummy wordlines.

9. The storage device of claim 1, wherein one of the wordlines is an active wordline included in a first deck, and the storage device further includes at least one additional deck, the first deck further including two or more dummy wordlines, and wherein the controller is configured to discharge wordlines in the at least one additional deck after discharging the two or more dummy wordlines in the first deck.

10. A three-dimensional (3D) NAND die comprising
a 3D NAND array including strings of NAND memory cells; and
logic to:

program NAND memory cells in a first string including a plurality of wordlines to store charges having programmed charge levels, the programmed NAND memory cells comprising one or more programmed wordlines;

apply a voltage to at least one of the plurality of wordlines of the first string to perform a program verify;

identify a set of one or more erased wordlines of the first string;

discharge the set of one or more erased wordlines of the first string; and discharge the one or more programmed wordlines of the first string after discharging the one or more erased wordlines of the first string, wherein a first operation of discharging the set of one or more erased wordlines is completed before a second operation of discharging the one or more programmed wordlines.

11. The 3D NAND die of claim 10, comprising:

one or more decks, each deck including a plurality of stacked tiers of NAND memory cells, each tier comprising a two-dimensional (2D) array of NAND memory cells arranged in a first pattern and coupled to a wordline for the tier; and a 2D array of pillars passing vertically through the stacked tiers of memory cells in the one or more decks, the 2D array having a second pattern substantially matching the first pattern, wherein a first pillar includes a channel connected to at least one of a select gate source (SGS) and a select gate drain (SGD), and wherein the first string of NAND memory cells comprises NAND memory cells coupled to wordlines in respective tiers sharing the first pillar.

12. The 3D NAND die of claim 10, comprising one or more decks of stacked tiers of memory cells, each tier having a respective wordline, wherein one of the wordlines is an active wordline, further including logic to:

for a first deck including the active wordline, discharge any erased wordlines for the first deck prior to discharging a subset of programmed wordlines for the first deck including the active wordline.

13. The 3D NAND die of claim 10, wherein the logic is configured to discharge at least a portion of the one or more programmed wordlines using a staggered discharge sequence.

14. The 3D NAND die of claim 12, wherein the 3D NAND die has one or more additional decks, and wherein the logic is configured to discharge programmed wordlines in the one or more additional decks after discharging the programmed wordlines in the first deck.

15. The 3D NAND die of claim 10, further comprising at least two dummy wordlines, wherein the logic is further configured to:

after discharging the set of one or more erased wordlines, and discharge the at least two dummy wordlines after discharging the one or more programmed wordlines.

16. A method performed using a three-dimensional (3D) NAND memory device having a plurality of NAND memory strings arranged vertically and a plurality of wordlines arranged horizontally, comprising:

programming NAND memory cells in a first string including a plurality of wordlines to store charges having programmed charge levels, the programmed NAND memory cells comprising one or more programmed wordlines;

applying a voltage to at least one of the plurality of wordlines of the first string to perform a program verify;

identifying a set of one or more erased wordlines of the first string;

discharging the set of one or more erased wordlines of the first string; and discharge the one or more programmed wordlines of the first string after discharging the one or more erased wordlines of the first string, wherein a first operation of discharging the set of one or more erased wordlines is completed before a second operation of discharging the one or more programmed wordlines.

17. The method of claim 16, wherein the 3D NAND memory device comprises multiple decks of stacked tiers of memory cells and wherein one of the wordlines is an active wordline, further comprising:

identifying a deck including the active wordline as an active deck;

for the active deck, discharging erased wordlines for the active deck first; and discharging programmed wordlines for the active deck; and subsequently, discharging wordlines for one or more of the multiple decks other than the active deck.

18. The method of claim 17, wherein the wordlines for the one or more of the multiple decks other than the active deck are discharged on a deck-by-deck basis, the wordlines for each of the one or more of the multiple decks being concurrently discharged.

19. The method of claim 17, further comprising:

after discharging the programmed wordlines for the active deck, discharging dummy wordlines for the active deck before discharging wordlines for one or more of the multiple decks other than the active deck.

20. The method of claim 17, wherein the wordlines for the one or more of the multiple decks other than the active deck are discharged concurrently.

*   *   *   *   *